(12) United States Patent
Hori et al.

(10) Patent No.: US 10,636,740 B2
(45) Date of Patent: Apr. 28, 2020

(54) SEMICONDUCTOR DEVICE, METHOD FOR MANUFACTURING SEMICONDUCTOR DEVICE, AND INTERFACE UNIT

(71) Applicants: FUJI ELECTRIC CO., LTD., Kawasaki (JP); KOJIN Co., Ltd., Nakaniikawa-gun, Toyama (JP)

(72) Inventors: Motohito Hori, Matsumoto (JP); Yuki Inaba, Matsumoto (JP); Yoshinari Ikeda, Matsumoto (JP); Tetsuya Sunago, Toyama (JP); Michihiro Inaba, Toyama (JP)

(73) Assignees: FUJI ELECTRIC CO., LTD., Kawasaki (JP); KOJIN CO., LTD., Toyama (JP)

( * ) Notice: Subject to any disclaimer, the term of this patent is extended or adjusted under 35 U.S.C. 154(b) by 91 days.

(21) Appl. No.: 15/934,256

(22) Filed: Mar. 23, 2018

(65) Prior Publication Data
US 2018/0294208 A1 Oct. 11, 2018

(30) Foreign Application Priority Data

Apr. 5, 2017 (JP) .................................. 2017-075243

(51) Int. Cl.
*H01L 23/528* (2006.01)
*H01L 25/10* (2006.01)
(Continued)

(52) U.S. Cl.
CPC ........ *H01L 23/5286* (2013.01); *H01L 23/492* (2013.01); *H01L 23/49575* (2013.01);
(Continued)

(58) Field of Classification Search
CPC ............... H01L 23/5286; H01L 25/105; H01L 23/49575; H01L 25/10; H01L 23/492; H01L 23/50; H01L 23/36
See application file for complete search history.

(56) References Cited

U.S. PATENT DOCUMENTS 9,504,154 B2 11/2016 Tada et al.
2010/0148298 A1* 6/2010 Takano ............. H01L 23/49575
257/500
(Continued)

FOREIGN PATENT DOCUMENTS

JP 2014-236150 12/2014
WO WO 2016/031462 A1 3/2016

*Primary Examiner* — Selim U Ahmed
*Assistant Examiner* — Evan G Clinton

(57) ABSTRACT

A semiconductor device includes a base plate, a plurality of semiconductor units provided in parallel on the base plate, the plurality of semiconductor units implementing a pair, each semiconductor unit including a semiconductor chip and a rod-shaped unit-side control terminal, the unit-side control terminal being connected to the semiconductor chip, the unit-side control terminal extending opposite to the base plate; and an interface unit including a box-shaped accommodating portion, the accommodating portion being provided on the plurality of semiconductor units, the accommodating portion including an internal wiring and a rod-shaped external-connecting control terminal, the internal wiring being connected to each of the plurality of the unit-side control terminals extending from the plurality of semiconductor units, the external-connecting control terminal extending to the outside opposite to the semiconductor units, the external-connecting control terminal being connected to the internal wiring.

13 Claims, 19 Drawing Sheets

(51) Int. Cl.
    *H01L 23/495*     (2006.01)
    *H01L 25/07*     (2006.01)
    *H01L 25/18*     (2006.01)
    *H01L 23/492*     (2006.01)
    *H01L 23/50*     (2006.01)
    *H01L 23/36*     (2006.01)
    *H01L 23/498*     (2006.01)

(52) U.S. Cl.
    CPC ............ *H01L 23/50* (2013.01); *H01L 25/072* (2013.01); *H01L 25/10* (2013.01); *H01L 25/105* (2013.01); *H01L 25/18* (2013.01); *H01L 23/36* (2013.01); *H01L 23/49811* (2013.01); *H01L 2924/13055* (2013.01); *H01L 2924/13091* (2013.01)

(56) References Cited

U.S. PATENT DOCUMENTS

2014/0355219 A1* 12/2014 Tada .................. H05K 1/0263
                                                            361/729
2016/0343641 A1   11/2016 Hori et al.

\* cited by examiner

SEMICONDUCTOR DEVICE, METHOD FOR MANUFACTURING SEMICONDUCTOR DEVICE, AND INTERFACE UNIT

CROSS REFERENCE TO RELATED APPLICATIONS AND INCORPORATION BY REFERENCE

This application claims benefit of priority under 35 USC 119 based on Japanese Patent No. P2017-075243 filed Apr. 5, 2017, the entire contents of which are incorporated by reference herein.

BACKGROUND OF THE INVENTION

1. Field of the Invention

The present invention relates to a technique which connects a semiconductor device, which includes semiconductor modules connected in parallel to each other, to an external apparatus through an interface unit.

2. Description of the Related Art

A semiconductor device, particularly, a power semiconductor device is connected to an external apparatus, such as a general-purpose inverter, through a printed circuit board or a bus bar provided in the external apparatus by soldering or screw tightening. However, when a semiconductor device which includes a plurality of semiconductor units connected in parallel to an external apparatus, the number of wirings to be drawn between the semiconductor device and the external apparatus increases according to the number of semiconductor units. In particular, significant restrictions in the design or use of the external apparatus, because the number of wirings serving as a path through which a control signal for a semiconductor chip transmits increases. As a result, flexibility in the design is reduced and costs increases.

As a technique to connect a semiconductor device to an external apparatus, for example, WO2016/031462A discloses a cooler, a plurality of power semiconductor units which are fixed side by side onto the cooler, and a bus bar unit which electrically connects the power semiconductor units each other. The bus bar unit includes bus bars which connect collector external terminals between the power semiconductor units, or bus bars which connect emitter external terminals between the power semiconductor units.

JP2014-236150A discloses a printed substrate which electrically connects external connection terminals between power semiconductor modules each other. The power semiconductor modules are connected in parallel to each other. A circuit pattern for electrical connecting to an external connection terminal for control or measurement purpose is provided on the printed substrate. In addition, an external terminal which is connected to the circuit pattern and extends in the up-down direction is provided on the printed substrate.

However, in WO2016/031462A, the bus bar unit includes a terminal base portion, and P terminal and N terminal for external connecting which are separately provided, protruding from the terminal base portion. Therefore, the overall structure of the bus bar unit is complicated and it is inconvenient to handle the bus bar unit. In addition, in JP2014-236150A, a semiconductor module case is further provided over the printed substrate in order to connect the power semiconductor module to an external apparatus. Therefore, a burden exists in the connecting operation.

SUMMARY OF THE INVENTION

The present invention has been made in view of the above-mentioned problems and an object of the present invention is to provide an interface unit which can reduce a burden in an operation of connecting a semiconductor device to an external apparatus, a semiconductor device in which the interface unit is used, and a method for manufacturing the semiconductor device.

In order to solve the above-mentioned problems, an aspect of a semiconductor device according to the present invention includes: a base plate; a plurality of semiconductor units provided in parallel on the base plate, the plurality of semiconductor units implementing a pair, each semiconductor unit including a semiconductor chip and a rod-shaped unit-side control terminal, the unit-side control terminal being connected to the semiconductor chip, the unit-side control terminal extending opposite to the base plate; and an interface unit including a box-shaped accommodating portion, the accommodating portion being provided on the plurality of semiconductor units, the accommodating portion including an internal wiring and a rod-shaped external-connecting control terminal, the internal wiring being connected to each of the plurality of the unit-side control terminals extending from the plurality of semiconductor units, the external-connecting control terminal extending to the outside opposite to the semiconductor units, the external-connecting control terminal being connected to the internal wiring.

An aspect of a method for manufacture a semiconductor device according to the present invention includes: providing a plurality of semiconductor units in parallel on a base plate, the plurality of semiconductor units implementing a pair, each semiconductor unit including a semiconductor chip and a rod-shaped unit-side control terminal, the unit-side control terminal being connected to the semiconductor chip, the unit-side control terminal extending opposite to the base plate; mounting an interface unit on the plurality of semiconductor units, the interface unit including a box-shaped accommodating portion, the accommodating portion including an internal wiring and a rod-shaped external-connecting control terminal, the internal wiring being connected to each of the plurality of the unit-side control terminals extending from the plurality of semiconductor units, the external-connecting control terminal extending to the outside opposite to the semiconductor units, the external-connecting control terminal being connected to the internal wiring; and connecting the unit-side control terminals of the plurality of semiconductor units and the internal wiring.

An aspect of an interface unit used in a semiconductor device according to the present invention includes a box-shaped accommodating portion provided on a plurality of semiconductor units, the plurality of semiconductor units being provided in parallel, the plurality of semiconductor units implementing a pair, each semiconductor unit including a semiconductor chip and a rod-shaped unit-side control terminal, the unit-side control terminal being connected to the semiconductor chip, the unit-side control terminal extending opposite to a base plate, wherein the accommodating portion includes an internal wiring and a rod-shaped external-connecting control terminal, the internal wiring being connected to each of the plurality of the unit-side control terminals extending from the plurality of semiconductor units, the external-connecting control terminal extending to the outside opposite to the semiconductor units, the external-connecting control terminal being connected to the internal wiring.

DETAILED DESCRIPTION OF THE PREFERRED EMBODIMENTS

Figure 1:
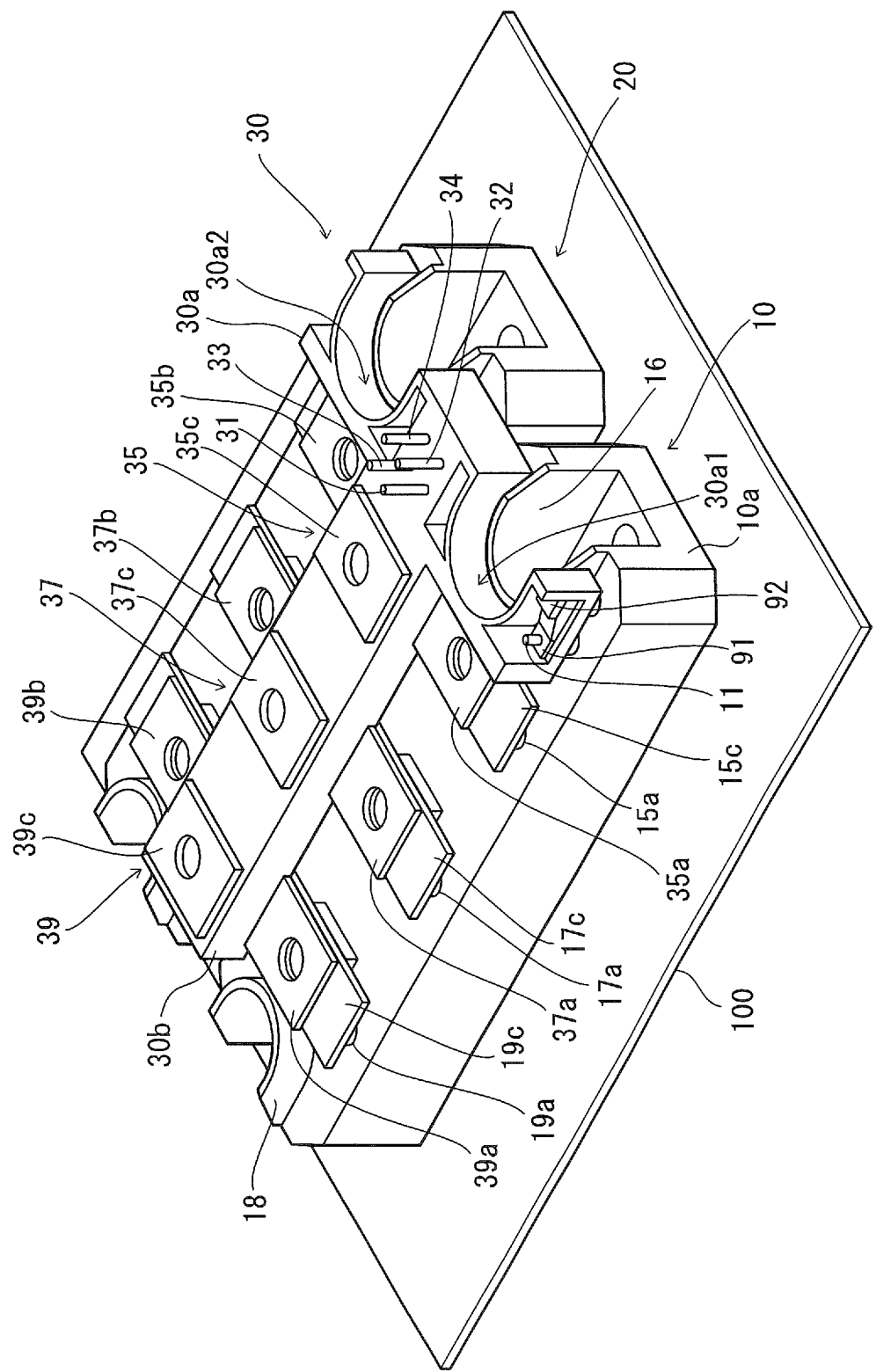
FIG. 1 is a perspective view (bird's eye view) schematically illustrating the outline of a structure of a semiconductor device according to an embodiment of the present invention.

Hereinafter, an embodiment of the present invention will be described. In the description of the following drawings, the same or similar portions are denoted by the same or similar reference numerals. However, the drawings are schematically illustrated and it is noted that, for example, the relationship between a thickness and plane dimensions and the thickness ratio of each device or each member are different from the actual relationship and the actual thickness ratio. Therefore, the detailed thickness or dimensions can be determined with reference to the following description. In addition, of course, the drawings include portions with different dimensional relationships or ratios.

In the following description, the "left-right" or "up-down" direction is simply defined for only convenience of explanation and does not limit the technical spirit of the present invention. Therefore, for example, when the plane of paper is rotated 90 degrees, the "left-right" direction and the "up-down" direction are switched. Of course, when the plane of paper is rotated 180 degrees, the "left" changes to the "right" and the "right" changes to the "left".

<Semiconductor Device>

As illustrated in FIG. 1, a semiconductor device according to an embodiment of the present invention includes a set of two semiconductor units 10, 20 which implement a pair and are provided side by side on a base plate 100 made of metal, and an interface unit 30 which is provided on the semiconductor units 10, 20 so as to be laid across the semiconductor units 10, 20. The interface unit 30 connects corresponding terminals in parallel in the semiconductor units 10, 20. The semiconductor device can be connected to an apparatus-side bus bar by screws—bolts—. The apparatus-side bus bar is provided in an external apparatus, such as a general-purpose inverter, through the interface unit 30.

Each of the pair of semiconductor units 10, 20 has a rectangular parallelepiped shape. In each of the pair of semiconductor units 10, 20, a semiconductor module on which a power semiconductor chip is mounted is sealed by a sealing resin 10a. Each upper end of an upper-arm emitter-signal terminal 11, a collector connection terminal 15a, an emitter connection terminal 17a, and an output connection terminal 19a which extend upward from the inside of the sealing resin 10a of the semiconductor unit 10 located on the front left side in FIG. 1 are illustrated in upper area of the sealing resin 10a. In addition, an collector bus bar terminal 15c, a emitter bus bar terminal 17c, and an output bus bar terminal 19c which have a rectangular plate shape in a plane pattern are provided at the center region of the top surface of the sealing resin 10a. Furthermore, skirts 16, 18 are provided at both ends of a longitudinal direction of the top surface of the sealing resin 10a respectively so as to implement side-walls which stand up vertically.

The interface unit 30 includes an accommodating portion 30a which accommodates internal wirings, and a supporting portion 30b which supports a collector main-terminal connecting bar 35, an emitter main-terminal connecting bar 37, and an output main-terminal connecting bar 39. The accommodating portion 30a includes cutouts 30a1, 30a2 having a shape corresponding to the side-wall of the skirt 16 of the semiconductor unit 10 and the side-wall of the skirt of the semiconductor unit 20, respectively. A first emitter-signal internal wiring 91 and a first gate-signal internal wiring 92 are partially exposed at a left end which is located on the front center side of the accommodating portion 30a in FIG. 1. A first emitter-signal terminal 31, a first gate-signal terminal 32, a second emitter-signal terminal 33, and a second gate-signal terminal 34 which have a rod shape are provided at the center region of the flat top surface of the accommodating portion 30a.

The collector main-terminal connecting bar 35, the emitter main-terminal connecting bar 37, and the output main-terminal connecting bar 39 of the supporting portion 30b include collector bus bar connecting portions 35a, 35b, emitter bus bar connecting portions 37a, 37b, and output bus bar connecting portions 39a, 39b which extend in a horizontal direction, respectively. In addition, the collector main-terminal connecting bar 35, the emitter main-terminal connecting bar 37, and the output main-terminal connecting bar 39 include a collector external connecting portion 35c, an emitter external connecting portion 37c, and an output external connecting portion 39c which are provided on the top surface of the supporting portion 30b, respectively.

Figure 2:
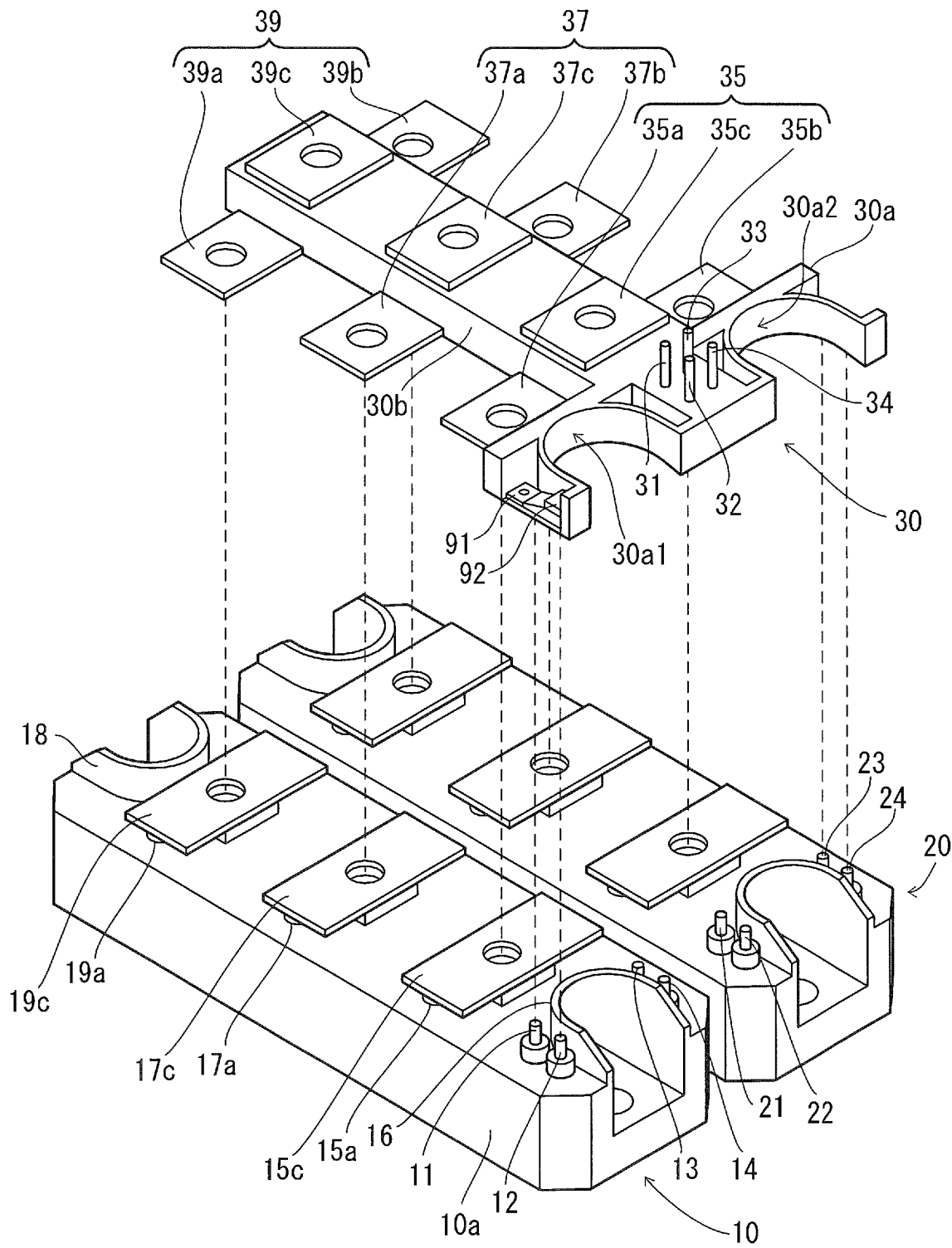
FIG. 2 is an exploded perspective view schematically illustrating the outline of the structure of the semiconductor device according to the embodiment of the present invention.

As illustrated in FIG. 2, the pair of semiconductor units 10, 20 are provided side by side along the direction of the shorter-sides such that the longer-sides of rectangles are adjacent to each other in parallel. Each upper end of a left-side gate-signal terminal 12, an lower-arm emitter-signal terminal 13, and a right-side gate-signal terminal 14 which extend in a straight line upward from the inside of the sealing resin 10a, similarly to the upper-arm emitter-signal terminal 11, are illustrated around the skirt 16 of the sealing resin 10a of the semiconductor unit 10 which is located on the front side in FIG. 2. In addition, each upper end of an upper-arm emitter-signal terminal 21, a left-side gate-signal terminal 22, an lower-arm emitter-signal terminal 23, and a right-side gate-signal terminal 24 which extend in a straight line upward from the inside of the sealing resin are illustrated around the skirt of the sealing resin of the semiconductor unit 20 which is located on the rear side in FIG. 2. In the pair of semiconductor units 10, 20, the same members have the same structure and function. Therefore, hereinafter, the semiconductor unit 10 illustrated on the left side in FIG. 3 will be mainly described as a representative example and the description of the same members will not be repeated.

Figure 3:
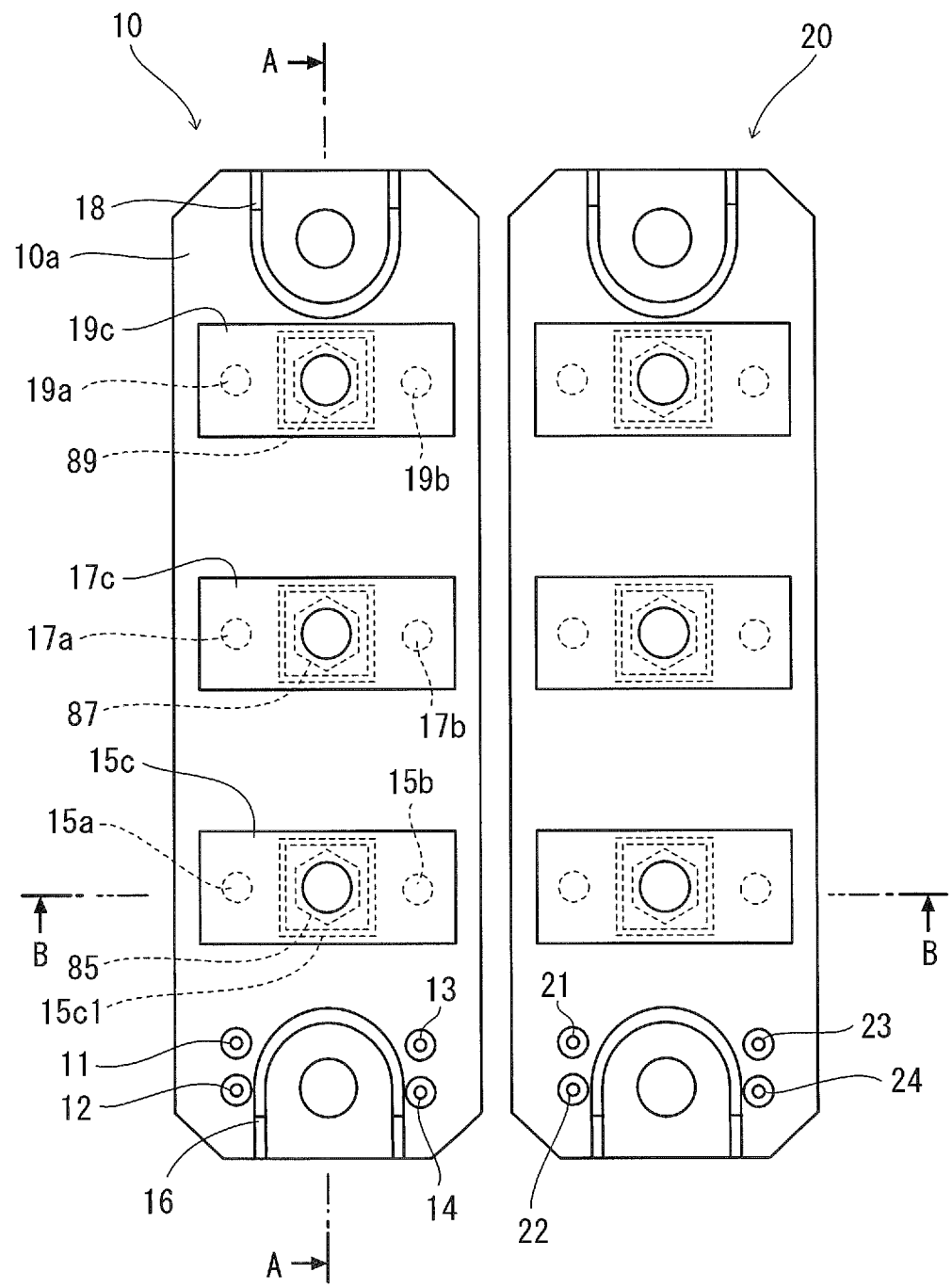
FIG. 3 is a plan view schematically illustrating the outline of the structure of a pair of semiconductor units which are connected in parallel to each other in the semiconductor device according to the embodiment of the present invention.

As illustrated in FIG. 3, the collector bus bar terminal 15c, the emitter bus bar terminal 17c, and the output bus bar terminal 19c of the semiconductor unit 10 are provided at equal intervals such that the longitudinal direction of each terminal is aligned with the direction of the shorter-side of the semiconductor unit 10.

Each of the collector bus bar terminal 15c, the emitter bus bar terminal 17c, and the output bus bar terminal 19c is made of, for example, copper (Cu) or aluminum (Al) and is conductive. Circular through-holes are provided at the center of each of the collector bus bar terminal 15c, the emitter bus bar terminal 17c, and the output bus bar terminal 19c. Circular through-holes are substantially concentric with corresponding hexagonal nut holes respectively represented by a dashed line in FIG. 3 and are provided in the upper part of the sealing resin 10a.

Both ends of the bottom surface of each of the collector bus bar terminal 15c, the emitter bus bar terminal 17c, and the output bus bar terminal 19c are bonded to the collector connection terminals 15a, 15b, the emitter connection terminals 17a, 17b, and the output connection terminals 19a, 19b which have a rod shape and extend from the inside of the sealing resin in a straight line. The collector connection terminals 15a, 15b, the emitter connection terminals 17a, 17b, and the output connection terminals 19a, 19b implement a pair, respectively.

The collector connection terminals 15a, 15b are bonded to the collector bus bar terminal 15c above the sealing resin 10a, the emitter connection terminals 17a, 17b are bonded to the emitter bus bar terminal 17c above the sealing resin 10a, and the output connection terminals 19a, 19b are bonded to the output bus bar terminal 19c above the sealing resin 10a by welding or soldering etc., respectively. A current is supplied to the bottom surface of a power semiconductor chip mounted on a semiconductor module by the collector connection terminals 15a, 15b. A current from the top surface of the power semiconductor chip flows to the outside through the emitter connection terminals 17a, 17b. An output current between wirings of the collector connection terminals 15a, 15b and wirings of the emitter connection terminals 17a, 17b flows through the output connection terminals 19a, 19b. Hereinafter, in the specification, the collector connection terminals 15a, 15b, the emitter connection terminals 17a, 17b, and the output connection terminals 19a, 19b are also referred to as "main terminals".

Fixing holes, through which screws etc. for fixing the semiconductor unit 10 to another member or device are inserted, are disposed respectively inside the skirts 16, 18 which are provided at both ends of the top surface of the sealing resin 10a of the semiconductor unit 10 in the up-down direction in FIG. 3. As illustrated in FIG. 3, the side-walls of the skirts 16, 18 have an arc shape in a plane pattern such that a wall surface surrounds the fixing hole.

Each upper end of the upper-arm emitter-signal terminal 11 and the lower-arm emitter-signal terminal 13 are illustrated on the left side and right side of the skirt 16 respectively, which is illustrated on the lower side in FIG. 3, at positions which are close to the center of the sealing resin 10a in the longitudinal direction. The upper-arm emitter-signal terminal 11 and the lower-arm emitter-signal terminal 13 are symmetrically provided with respect to the center of the skirt 16 on the same straight line aligned with the direction in which the pair of semiconductor units 10, 20 are arranged side by side. The upper-arm emitter-signal terminal 11 and the lower-arm emitter-signal terminal 13 detect an emitter voltage.

Figure 4:
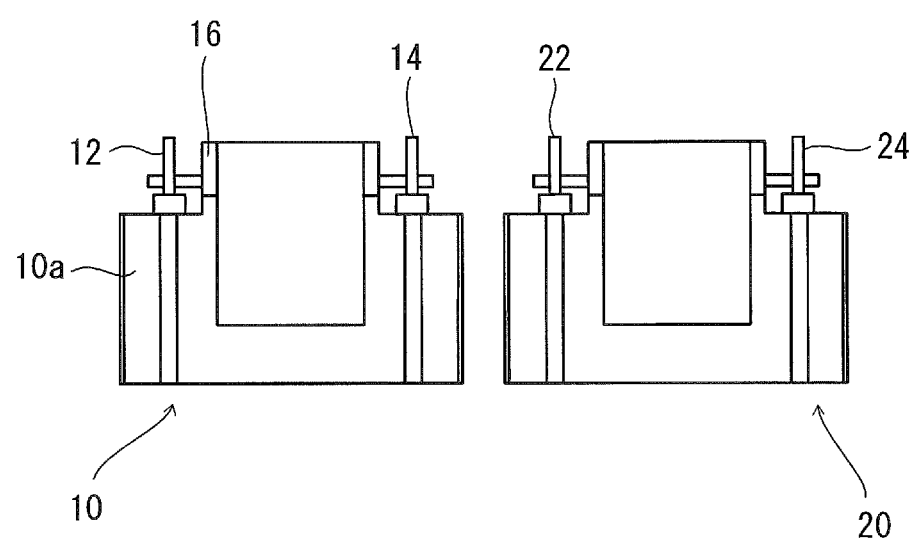
FIG. 4 is a side view schematically illustrating the outline of the structure of the pair of semiconductor units which are connected in parallel to each other in the semiconductor device according to the embodiment of the present invention. The shorter-side of the semiconductor device is illustrated on the front of FIG. 4, so as to measure a height of the semiconductor device.

Each upper end of the left-side gate-signal terminal 12 and the right-side gate-signal terminal 14 are illustrated at positions which are close to the left end portion and right end portion of the skirt 16 below the upper-arm emitter-signal terminal 11 and the lower-arm emitter-signal terminal 13 in FIG. 3, respectively. The left-side gate-signal terminal 12 and the right-side gate-signal terminal 14 are symmetrically provided with respect to the center of the skirt 16 on the same straight line aligned with the direction in which the pair of semiconductor units 10, 20 are arranged side by side. The left-side gate-signal terminal 12, the right-side gate-signal terminal 14, the upper-arm emitter-signal terminal 11 and the lower-arm emitter-signal terminal 13 are kept at substantially the same height. As illustrated in FIG. 4, an upper end surface of the left-side gate-signal terminal 12 and an upper end surface of the right-side gate-signal terminal 14 in the semiconductor unit 10 are slightly higher than an upper end surface of the skirt 16. The left-side gate-signal terminal 12 and the right-side gate-signal terminal 14 control the turn-on and turn-off of the power semiconductor chip.

Each of the upper-arm emitter-signal terminal 11, the left-side gate-signal terminal 12, the lower-arm emitter-signal terminal 13, and the right-side gate-signal terminal 14 can be made of a conductive material using metal such as Cu. The upper-arm emitter-signal terminal 11, the lower-arm emitter-signal terminal 13, the left-side gate-signal terminal 12, and the right-side gate-signal terminal 14 correspond to "unit-side control terminals" according to the present invention.

Figure 5:
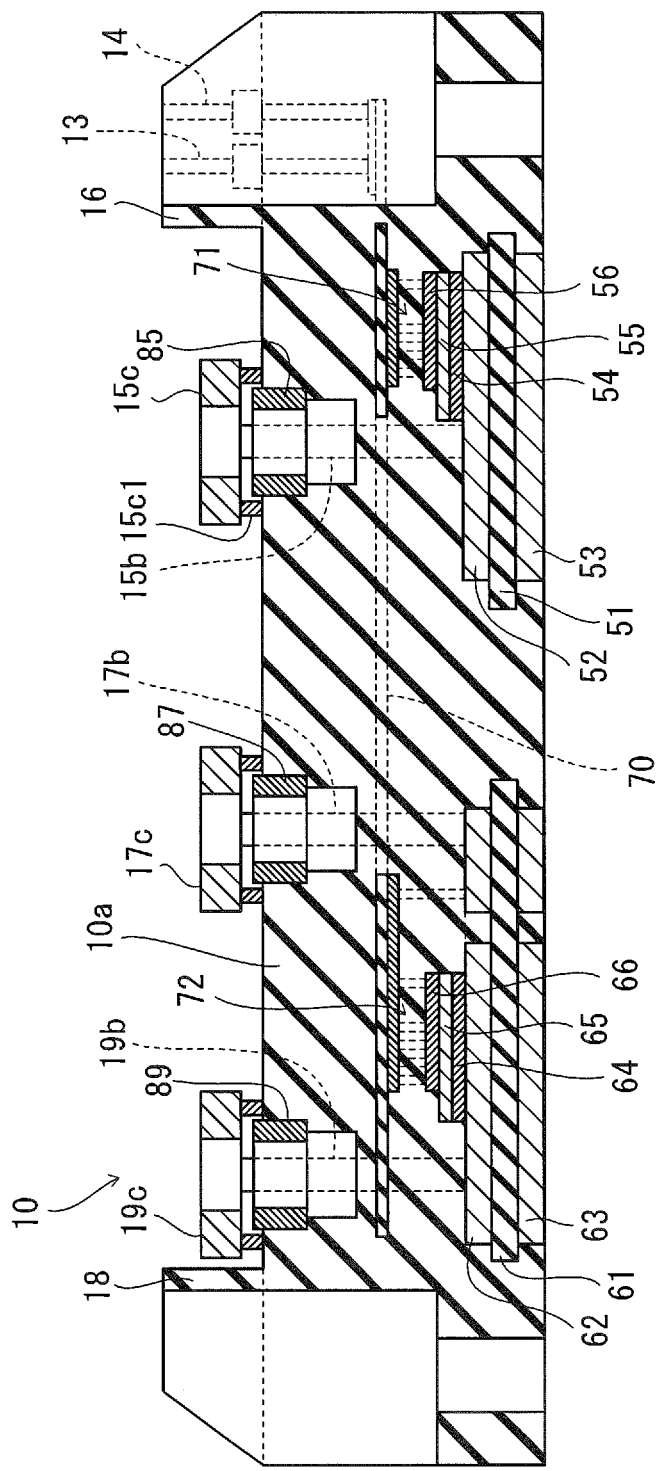
FIG. 5 is a cross-sectional view taken along the line A-A of FIG. 3.
Figure 6:
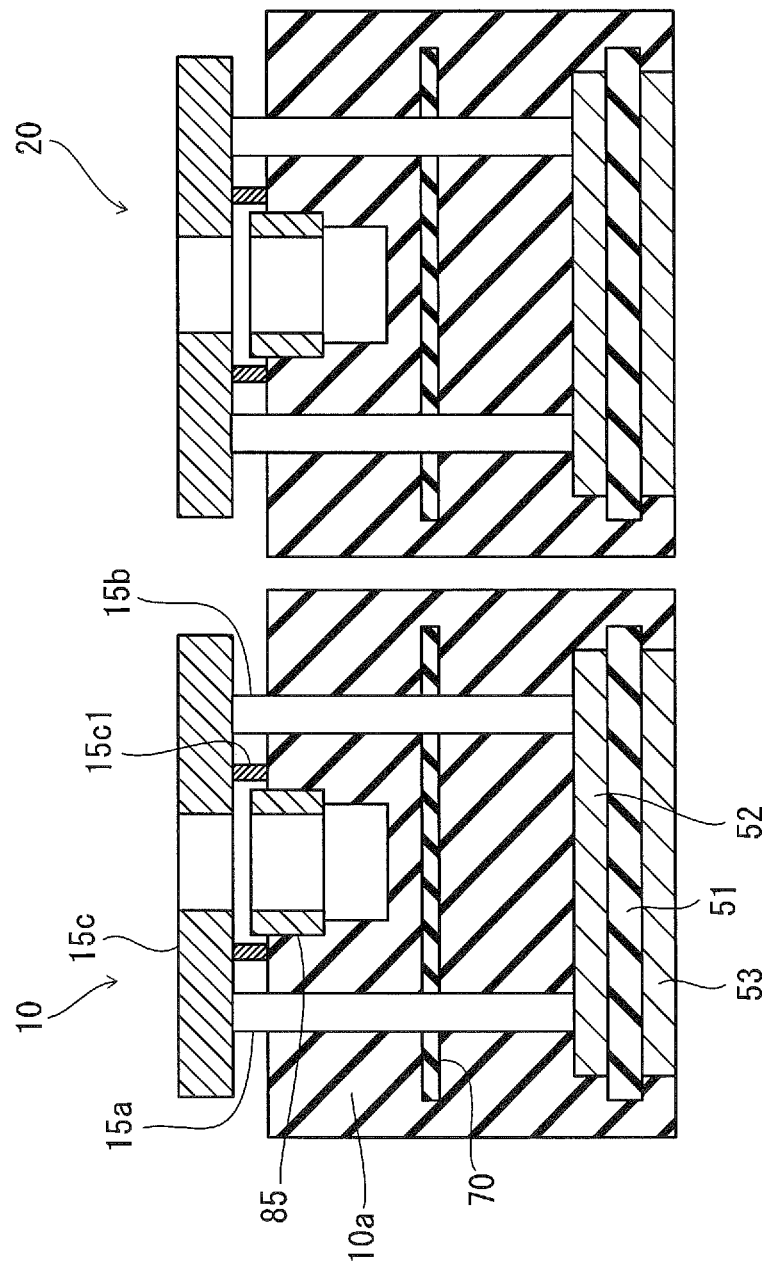
FIG. 6 is a cross-sectional view taken along the line B-B of FIG. 3.

As illustrated in FIG. 5, in the sealing resin 10a of the semiconductor unit 10, two semiconductor modules, which are power semiconductor modules, are provided along the longitudinal direction of the semiconductor unit 10. As illustrated in FIG. 6, two semiconductor modules are also provided in the sealing resin of the semiconductor unit 20. That is, each of the pair of semiconductor units 10, 20 is a so-called "2in1" type using a combination of two semiconductor modules. As illustrated in FIG. 5, in the upper part of the sealing resin 10a of the semiconductor unit 10, three nut gloves are provided below the collector bus bar terminal 15c, the emitter bus bar terminal 17c, and the output bus bar terminal 19c respectively. Nuts 85, 87, 89 for connecting to apparatus-side bus bars of an external apparatus are provided in the spaces of the nut gloves respectively.

A base seat 15c1 on which the collector bus bar terminal 15c is mounted is provided between the pair of collector connection terminals 15a, 15b above the top surface of the sealing resin 10a so as to surround the nut 85. As illustrated in FIG. 3, the base seat 15c1 has a frame which has an outer edge of rectangle in a plane pattern. In addition, a base seat without reference numeral on which the emitter bus bar terminal 17c is mounted is provided above the top surface of the sealing resin 10a so as to surround the nut 87. A base seat without reference numeral on which the output bus bar terminal 19c is mounted is provided above the top surface of the sealing resin 10a so as to surround the nut 89. The use of the nuts 85, 87, 89 makes it possible to connect a single semiconductor unit 10 to the apparatus-side bus bar provided in an external apparatus, such as a general-purpose inverter, through screws—bolts—.

Of two power semiconductor modules sealed in the semiconductor unit 10, the semiconductor module illustrated on the right side in FIG. 5 includes an insulating layer 51, a top-surface conductive layer 52 which is, for example, a copper plate and is provided on the top surface of the insulating layer 51, and a bottom-surface conductive layer 53 which is, for example, a copper plate and is provided on the bottom surface of the insulating layer 51. A bottom surface of the bottom-surface conductive layer 53 is bonded to the top surface of the base plate 100 illustrated in FIG. 1. A power semiconductor chip 55 is mounted on a top surface of the top-surface conductive layer 52 through solder 54.

A printed substrate 70 is provided above the power semiconductor chip 55. A rod-shaped post electrode 71 is provided between a bottom surface of the printed substrate 70 and a top surface of the power semiconductor chip 55 so as to extend downward. The post electrode 71 is bonded to solder 56 provided on the top surface of the power semiconductor chip 55 such that the electrical bonding between the power semiconductor chip 55 and the printed substrate 70 is ensured.

Similarly to the right semiconductor module, the semiconductor module illustrated on the left side in FIG. 5 includes an insulating layer 61, a top-surface conductive layer 62 which is provided on the top surface of the insulating layer 61, and a bottom-surface conductive layer 63 which is provided on the bottom surface of the insulating layer 61. A bottom surface of the bottom-surface conductive layer 63 is bonded to the top surface of the base plate 100 illustrated in FIG. 1. A power semiconductor chip 65 is mounted on a top surface of the top-surface conductive layer 62 through solder 64. A rod-shaped post electrode 72 which extends downward from the printed substrate 70 is electrically bonded to a top surface of the power semiconductor chip 65 through solder 66.

Figure 7:
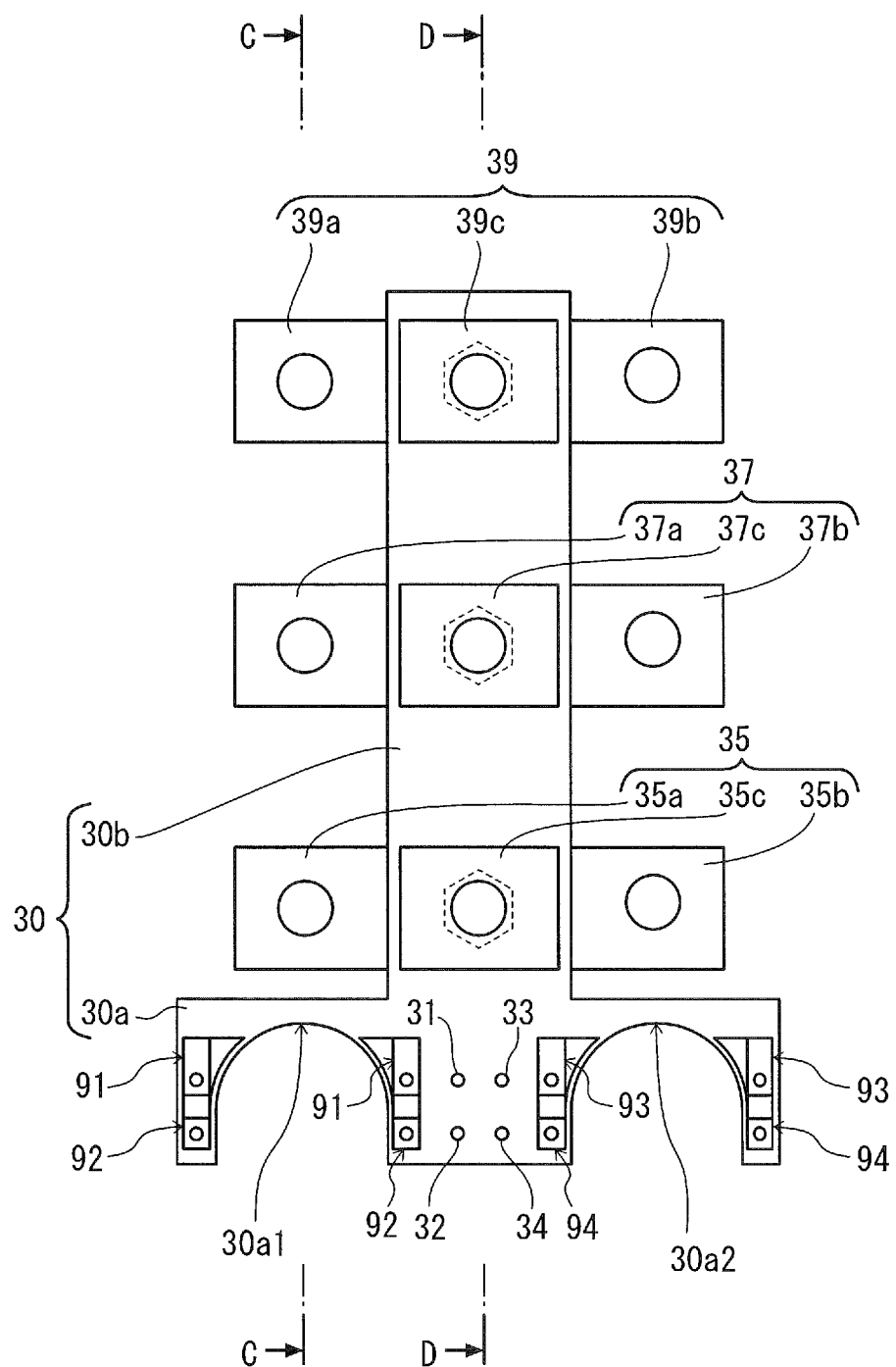
FIG. 7 is a plan view schematically illustrating the outline of the structure of an interface unit which connects the pair of semiconductor units in parallel in the semiconductor device according to the embodiment of the present invention.

Next, the interface unit 30 of the semiconductor device according to the embodiment of the present invention will be described. The accommodating portion 30a of the interface unit 30 illustrated in FIGS. 1 and 2 is rectangular parallelepiped box-type with an internal space. The supporting portion 30b is a rectangular parallelepiped with a rod shape. As illustrated in FIG. 7, a lower end of the supporting portion 30b in the longitudinal direction is bonded to the center of the accommodating portion 30a in the longitudinal direction such that the interface unit 30 has an inverted T-shape in a plane pattern.

—Accommodating Portion—

As illustrated in FIG. 7, in the accommodating portion 30a, the first emitter-signal terminal 31, the first gate-signal terminal 32, the second emitter-signal terminal 33, and the second gate-signal terminal 34 are located at four corners of a square respectively in a plane pattern so as to be arranged close to each other at equal intervals. Each of the first emitter-signal terminal 31, the first gate-signal terminal 32, the second emitter-signal terminal 33, and the second gate-signal terminal 34 has a rod shape and extends upward in the vertical direction such as the first gate-signal terminal 32 and the second gate-signal terminal 34 exemplified in FIG. 8.

The lower ends of the first emitter-signal terminal 31, the first gate-signal terminal 32, the second emitter-signal terminal 33, and the second gate-signal terminal 34 are inserted into the accommodating portion 30a and are connected to the corresponding internal wirings which are provided in the internal space respectively. The first emitter-signal terminal 31, the first gate-signal terminal 32, the second emitter-signal terminal 33, and the second gate-signal terminal 34 correspond to "external-connecting control terminals" according to the present invention.

The first emitter-signal terminal 31 is connected to the upper-arm emitter-signal terminal 11 of the semiconductor unit 10 and the upper-arm emitter-signal terminal 21 of the semiconductor unit 20 through a corresponding internal wiring at the same time. The first gate-signal terminal 32 is connected to the left-side gate-signal terminal 12 of the semiconductor unit 10 and the left-side gate-signal terminal 22 of the semiconductor unit 20 through a corresponding internal wiring at the same time. The second emitter-signal terminal 33 is connected to the lower-arm emitter-signal terminal 13 of the semiconductor unit 10 and the lower-arm emitter-signal terminal 23 of the semiconductor unit 20 through a corresponding internal wiring at the same time. The second gate-signal terminal 34 is connected to the right-side gate-signal terminal 14 of the semiconductor unit 10 and the right-side gate-signal terminal 24 of the semiconductor unit 20 through a corresponding internal wiring at the same time.

The cutouts 30a1, 30a2 of the accommodating portion 30a are provided in an arc shape in a plane pattern on the left side and right side of a central region in which external-connecting control terminals are disposed on the top surface of the accommodating portion 30a as shown in FIG. 7. The arc of the cutouts 30a1, 30a2 is delineated with the arc of the skirt 16 of the sealing resin 10a in the semiconductor unit 10. The width of the accommodating portion 30a in the direction of the shorter side is the smallest at each upper end of the cutouts 30a1, 30a2 illustrated in FIG. 7 between the central region in which four external-connecting control terminals are provided and each end of the left and right portions of the accommodating portion 30a respectively is corresponding to the up-down direction in FIG. 7.

As illustrated in FIG. 7, concave portions having openings of which the width in the left-right direction increases from the accommodating portion 30a to the supporting portion 30b in a plane pattern are provided on each opposite side of the two cutouts 30a1, 30a2 of the accommodating portion 30a to the central region of the accommodating portion 30a. The cutout 30a1 or 30a2 are interposed between the two concave portions, in bilaterally symmetric structure. One end portion of a first emitter-signal internal wiring 91 and one end portion of a first gate-signal internal wiring 92 are exposed through the concave portion which is located on the left side of the left cutout 30a1 of the accommodating portion 30a in FIG. 7.

In addition, similarly, the other end portion of the first emitter-signal internal wiring 91 and the other end portion of the first gate-signal internal wiring 92 are exposed through the concave portion which is located on the right side of the left cutout 30a1 in FIG. 7. Similarly, one end portion of a second emitter-signal internal wiring 93 and one end portion of a second gate-signal internal wiring 94 are exposed through the concave portion which is located on the left side of the right cutout 30a2 of the accommodating portion 30a in FIG. 7. Similarly, the other end portion of the second emitter-signal internal wiring 93 and the other end portion of the second gate-signal internal wiring 94 are exposed through the concave portion which is located on the right side of the right cutout 30a2 in FIG. 7.

Figure 9:
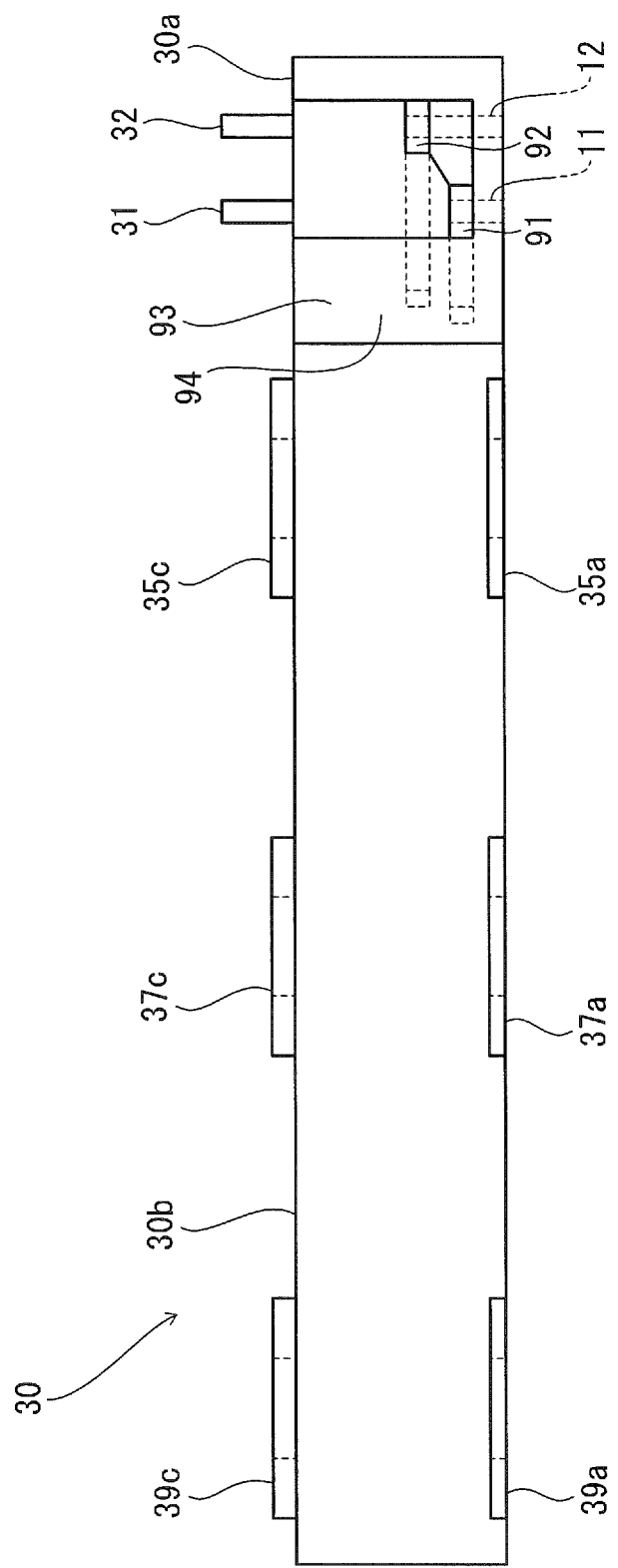
FIG. 9 is a side view schematically illustrating the outline of the structure of the interface unit used in the semiconductor device according to the embodiment of the present invention. The longer-side of a supporting portion of the interface unit is illustrated on the front of FIG. 9, so as to measure the height of the interface unit.

FIG. 9 illustrates the state of the exposed each end portion of the first emitter-signal internal wiring 91 and the first gate-signal internal wiring 92 provided in the concave portion which is located on the left side of the left cutout 30a1 of the accommodating portion 30a in the plane pattern illustrated in FIG. 7. A step having a difference in height is provided in a lower part of the concave portion that is illustrated on the right side in FIG. 9. An end portion of the first emitter-signal internal wiring 91 having a strip shape is provided on the top surface of a lower stage of the step such that the top surface of the end portion is horizontal. In addition, an end portion of the first gate-signal internal wiring 92 having a strip shape is provided on the top surface of an upper stage of the step such that the top surface of the end portion is horizontal. The step causes the top surfaces of the first emitter-signal internal wiring 91 and the first gate-signal internal wiring 92 to have different heights. Through-holes are implemented in each of the end portions provided. The lower-arm emitter-signal terminal 13 which extends from the semiconductor unit 10 provided below the accommodating portion 30a is inserted into the through-hole of the first emitter-signal internal wiring 91.

The position of the through-holes can be understood and estimated by the position of the upper parts of two dashed lines indicating the upper-arm emitter-signal terminal 11 which is perpendicular to the first emitter-signal internal wiring 91 at the right end of the first emitter-signal internal wiring 91 which extends horizontally. Here, reference numerals indicating the through-holes are not illustrated in FIG. 9. In addition, the upper end of the left-side gate-signal terminal 12 is inserted into the through-hole of the first gate-signal internal wiring 92.

Figure 10:
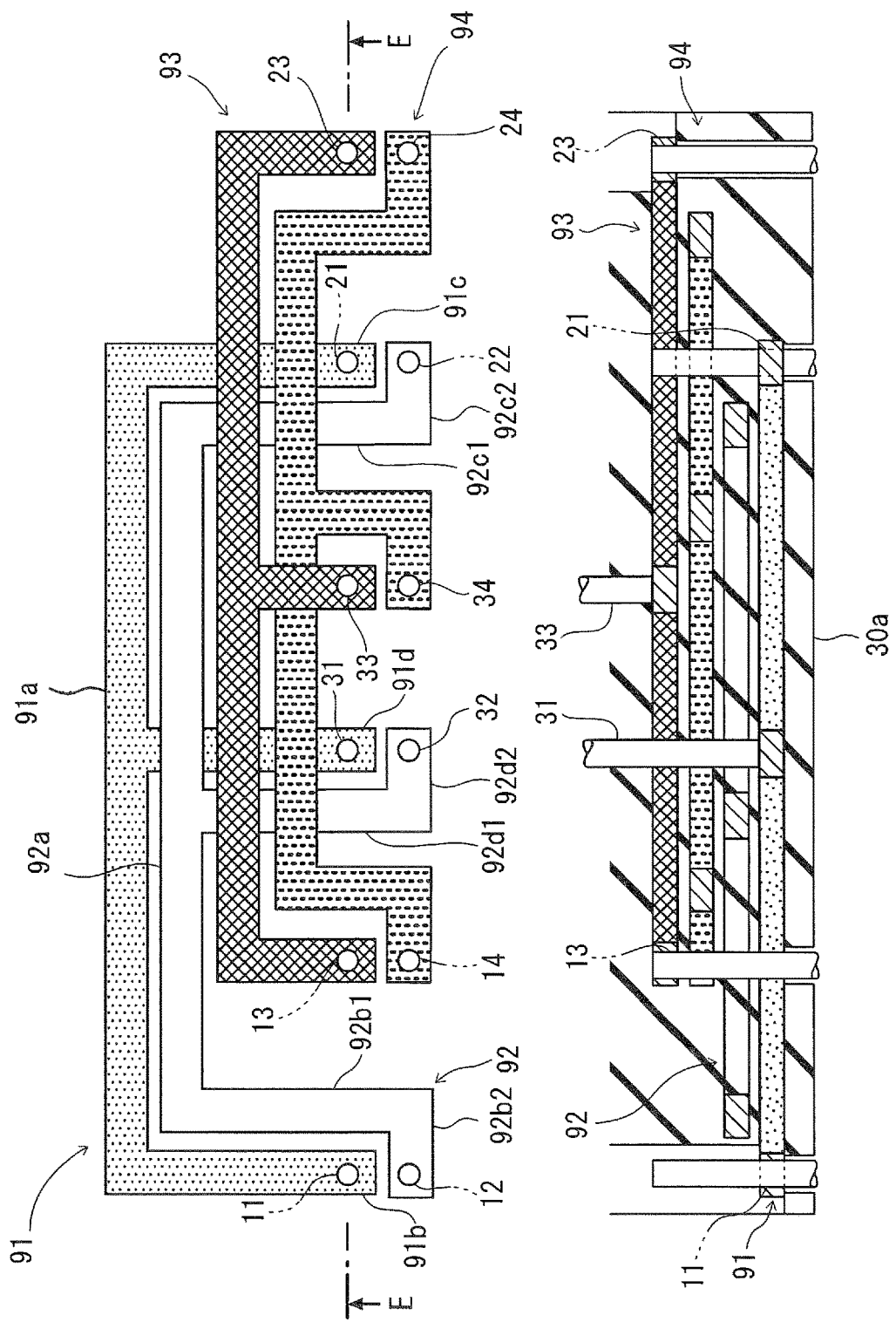
FIG. 10A is a plan view schematically illustrating the outline of internal wirings of the accommodating portion of the interface unit used in the semiconductor device according to the embodiment of the present invention.
FIG. 10B is a cross-sectional view taken along the line E-E of FIG. 10A.

The first emitter-signal internal wiring 91, the first gate-signal internal wiring 92, the second emitter-signal internal wiring 93, and the second gate-signal internal wiring 94 are arranged in the accommodating portion 30a as illustrated in FIG. 10A. However, for convenience of explanation, the dimensions of each of the wirings illustrated in FIGS. 10A and 10B are schematically illustrated. In some cases, the actual dimensions and scale are different from the dimensions and scale in FIGS. 10A and 10B. In addition, among four internal wirings illustrated in FIGS. 10A and 10B, three internal wirings except the first gate-signal internal wiring 92 are patterned for convenience of explanation.

As illustrated in FIGS. 10A and 10B, in the accommodating portion 30a, the first emitter-signal internal wiring 91, the first gate-signal internal wiring 92, the second gate-signal internal wiring 94, and the second emitter-signal internal wiring 93 are stacked in this order from the lower side to the upper side so as to be separated from each other in the vertical direction. For example, the spaces among the first emitter-signal internal wiring 91, the first gate-signal internal wiring 92, the second emitter-signal internal wiring 93, and the second gate-signal internal wiring 94 are filled with an insulating resin.

As illustrated in FIG. 10A, each of the first emitter-signal internal wiring 91, the first gate-signal internal wiring 92, the second emitter-signal internal wiring 93, and the second gate-signal internal wiring 94 has a base portion which extends in the left-right direction in FIG. 10A. The base portion includes a left branch portion, right branch portion and a central branch portion. The left and right branch portions extend along the up-down direction in FIG. 10A from both ends of the base portion so as to be perpendicular to the base portion. The central branch portion is interposed between the left branch portion and the right branch portion of the base portion, and extends from the center of the base portion in a direction perpendicular to the base portion, and extends in parallel to the left branch portion and the right branch portion. That is, each of the first emitter-signal internal wiring 91, the first gate-signal internal wiring 92, the second emitter-signal internal wiring 93, and the second gate-signal internal wiring 94 has a three-pronged structure having three branch portions which extend along the shorter-side of the accommodating portion 30a so as to be separated from each other.

For example, an upper region in FIG. 10A is focused, a base portion 91*a* of the first emitter-signal internal wiring 91 and a base portion 92*a* of the first gate-signal internal wiring 92 which is located below the base portion 91*a* are provided in parallel so as to be close to each other. In addition, when a left region in FIG. 10A is focused, a left branch portion 91*b* of the first emitter-signal internal wiring 91 and a first branch portion 92*b*1 of the left branch portion (92*b*1, 92*b*2) of the first gate-signal internal wiring 92 are provided in parallel so as to be close to each other.

The left branch portion (92*b*1, 92*b*2) of the first gate-signal internal wiring 92 includes the first branch portion 92*b*1 and a second branch portion 92*b*2. The second branch portion 92*b*2 extends in parallel to the base portion 92*a* from an end of the first branch portion 92*b*1. The end of the first branch portion 92*b*1 is opposite to the base portion 92*a*. The second branch portion 92*b*2 extends to the left side so as to be close to the end of the left branch portion 91*b* of the first emitter-signal internal wiring 91. Therefore, the through-hole provided at the end of the left branch portion 91*b* of the first emitter-signal internal wiring 91 and the through-hole provided at the end of the second branch portion 92*b*2 of the left branch portion (92*b*1, 92*b*2) of the first gate-signal internal wiring 92 are arranged on the same straight line along the up-down direction in FIG. 10A.

When a right region in FIG. 10A is focused, a right branch portion 91*c* of the first emitter-signal internal wiring 91 and a first branch portion 92*c*1 of a right branch portion (92*c*1, 92*c*2) of the first gate-signal internal wiring 92 are provided in parallel so as to be close to each other. The right branch portion (92*c*1, 92*c*2) of the first gate-signal internal wiring 92 includes the first branch portion 92*c*1 and a second branch portion 92*c*2. The second branch portion 92*c*2 extends in parallel to the base portion 92*a* from an end of the first branch portion 92*c*1. The end of the first branch portion 92*c*1 which is opposite to the base portion 92*a*. The second branch portion 92*c*2 extends to the right side so as to be close to the end of the right branch portion 91*c* of the first emitter-signal internal wiring 91. The through-hole provided at the end of the right branch portion 91*c* of the first emitter-signal internal wiring 91 and the through-hole provided at the end of the second branch portion 92*c*2 of the right branch portion of the first gate-signal internal wiring 92 are arranged on the same straight line along the up-down direction in FIG. 10A.

When a central region in FIG. 10A is focused, a central branch portion 91*d* of the first emitter-signal internal wiring 91 and a first central branch portion 92*d*1 of a central branch portion (92*d*1, 92*d*2) of the first gate-signal internal wiring 92 are provided in parallel so as to be close to each other. The central branch portion (92*d*1, 92*d*2) of the first gate-signal internal wiring 92 includes the first central branch portion 92*d*1 and a second central branch portion 92*d*2. The second branch portion 92*d*2 extends in parallel to the base portion 92*a* from an end of the first central branch portion 92*d*1. The end of the first branch portion 92*d*1 is opposite to the base portion 92*a*. The second central branch portion 92*d*2 extends to the right side so as to be close to the end of the central branch portion 91*d* of the first emitter-signal internal wiring 91. The through-hole provided at the end of the central branch portion 91*d* of the first emitter-signal internal wiring 91 and the through-hole provided at the end of the second central branch portion 92*d*2 of the central branch portion (92*d*1, 92*d*2) of the first gate-signal internal wiring 92 are arranged on the same straight line along the up-down direction in FIG. 10A.

The through-holes provided at each end of the left branch portion 91*b*, the right branch portion 91*c*, and the central branch portion 91*d* of the first emitter-signal internal wiring 91 are arranged on the same straight line along the direction of the longer side of the accommodating portion 30*a*, which is corresponding to the left-right direction in FIG. 10A. The shape of the through-holes can be understood and estimated from the circular edges of the upper-arm emitter-signal terminal 11 of the semiconductor unit 10, the upper-arm emitter-signal terminal 21 of the semiconductor unit 20, and the first emitter-signal terminal 31 of the accommodating portion 30*a* which are provided inside the leading ends of the first emitter-signal internal wiring 91 in FIG. 10A.

In addition, the through-holes provided in each of the first branch portion 92*b*1 of the left branch portion (92*b*1, 92*b*2), the first branch portion 92*c*1 of the right branch portion (92*c*1, 92*c*2), and the central branch portion (92*d*1, 92*d*2) in the first gate-signal internal wiring 92 are arranged on the same straight line along the direction of the longer-side of the accommodating portion 30*a*. As illustrated in FIG. 10A, the horizontal straight line connecting three through-holes of the first emitter-signal internal wiring 91 and the horizontal straight line connecting three through-holes of the first gate-signal internal wiring 92 are parallel to each other along the longitudinal direction of the accommodating portion 30*a*.

Similarly to the first emitter-signal internal wiring 91, the second emitter-signal internal wiring 93 has a three-pronged shape including a base portion, a left branch portion, a right branch portion and a central branch portion. Reference numerals of the left branch portion, the right branch portion and the central branch portion are omitted in FIGS. 10A and 10B, and the left branch portion, the right branch portion and the central branch portion extend from the base portion respectively, The length of each of three branches of the second emitter-signal internal wiring 93 is set such that through-holes provided at the leading ends of the left branch portion, the right branch portion, and the central branch portion of the second emitter-signal internal wiring 93 are arranged on the same straight line as the through-holes provided at the leading ends of the left branch portion 91*b*, the right branch portion 91*c*, and the central branch portion 91*d* of the first emitter-signal internal wiring 91 along the left-right direction in FIG. 10A.

Similarly to the first gate-signal internal wiring 92, the second gate-signal internal wiring 94 has a three-pronged shape including a base portion, a left branch portion, a right branch portion and a central branch portion. Reference numerals of the left branch portion, the right branch portion and the central branch portion are omitted in FIGS. 10A and 10B, and the left branch portion, the right branch portion and the central branch portion extend from the base portion respectively. The length of each of three branches of the second gate-signal internal wiring 94 is set such that through-holes provided at the leading ends of the left branch portion, the right branch portion, and the central branch portion of the second gate-signal internal wiring 94 are arranged on the same straight line as the through-holes provided at the leading ends of the left branch portion (92*b*1, 92*b*2), the right branch portion (92*c*1, 92*c*2), and the central branch portion (92*d*1, 92*d*2) of the first gate-signal internal wiring 92 along the left-right direction in FIG. 10A.

Through-holes are provided at each corresponding position to upper end of the upper-arm emitter-signal terminal 11, the left-side gate-signal terminal 12, the lower-arm emitter-signal terminal 13, and the right-side gate-signal terminal 14 which extend from the semiconductor unit 10 provided below the accommodating portion 30a, in the lower part of the accommodating portion 30a. In the cross-sectional view illustrated in FIG. 10B, four through-holes are provided at the lower end of the accommodating portion 30a along the left-right direction. FIG. 10B illustrates the upper-arm emitter-signal terminal 11 and the lower-arm emitter-signal terminal 13 of the semiconductor unit 10 which are inserted into two left through-holes among the four through-holes. In addition, FIG. 10B also illustrates the upper-arm emitter-signal terminal 21 and the lower-arm emitter-signal terminal 23 of the semiconductor unit 20 which are inserted into two right through-holes among the four through-holes.

The four through-holes are vertically concentric with the through-holes provided at each end of the left branch portion and each end of the right branch portion, of the first emitter-signal internal wiring 91, the first gate-signal internal wiring 92, the second emitter-signal internal wiring 93, and the second gate-signal internal wiring 94.

As illustrated in FIG. 10B, the upper end of the upper-arm emitter-signal terminal 11 in the semiconductor unit 10 is inserted into the through-hole provided in the lower part of the accommodating portion 30a and the corresponding through-hole provided at the end of the left branch portion 91b of the first emitter-signal internal wiring 91 which is provided above the through-hole of the accommodating portion 30a simultaneously. The lower-arm emitter-signal terminal 13 is electrically bonded to the first emitter-signal internal wiring 91. Similarly to the upper-arm emitter-signal terminal 11, the left-side gate-signal terminal 12, the lower-arm emitter-signal terminal 13, and the right-side gate-signal terminal 14 in the semiconductor unit 10 are inserted into the accommodating portion 30a and are bonded to the corresponding internal wiring among the three internal wirings, respectively.

FIG. 10B illustrates a state in which the lower end of the first emitter-signal terminal 31 is bonded onto the leading end of the central branch portion 91d among three branch portions of the first emitter-signal internal wiring 91. In addition, FIG. 10B illustrates a state in which the lower end of the second emitter-signal terminal 33 is bonded onto the leading end of the central branch portion among three branch portions of the second emitter-signal internal wiring 93 on the right side of the first emitter-signal terminal 31.

—Supporting Portion—

Each of the collector main-terminal connecting bar 35, the emitter main-terminal connecting bar 37, and the output main-terminal connecting bar 39 provided in the supporting portion 30b of the interface unit 30 is made of a conductive plate-shaped member such as Cu. Each of the collector main-terminal connecting bar 35, the emitter main-terminal connecting bar 37, and the output main-terminal connecting bar 39 has four bent portions such that a central region is inverted U-shaped and is bilaterally symmetric in a view along a direction in which a thickness can be understood and estimated, such as the collector main-terminal connecting bar 35 exemplified in FIG. 8.

Figure 8:
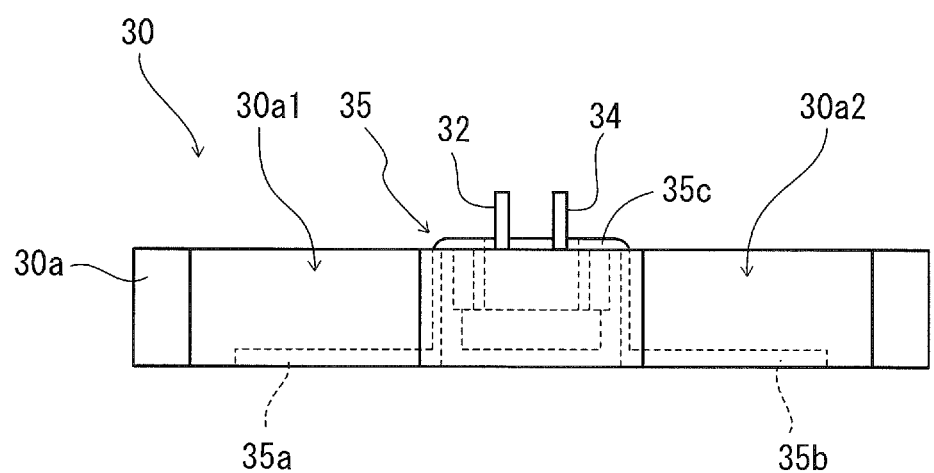
FIG. 8 is a side view schematically illustrating the outline of the structure in which the interface unit connects the pair of semiconductor units in parallel in the semiconductor device according to the embodiment of the present invention. The longer-side of an accommodating portion of the interface unit and the shorter-side of the accommodating portion and the shorter-side of the semiconductor device are illustrated on the front of FIG. 8, so as to measure a height of the interface unit.

In FIG. 8, each main surface of the left-end region and the right-end region of the collector main-terminal connecting bar 35 horizontally extend and serves as the collector bus bar connecting portions 35a, 35b which are fixed and electrically bonded to both the collector bus bar terminal 15c of the semiconductor unit 10 and the output bus bar terminal of the semiconductor unit 20 below the supporting portion. In addition, the bottom of the U-shaped portion of the collector main-terminal connecting bar 35 is the collector external connecting portion 35c which is fixed to an apparatus-side bus bar of an external apparatus by a screw etc. and is electrically connected to the apparatus-side bus bar.

Figure 11:
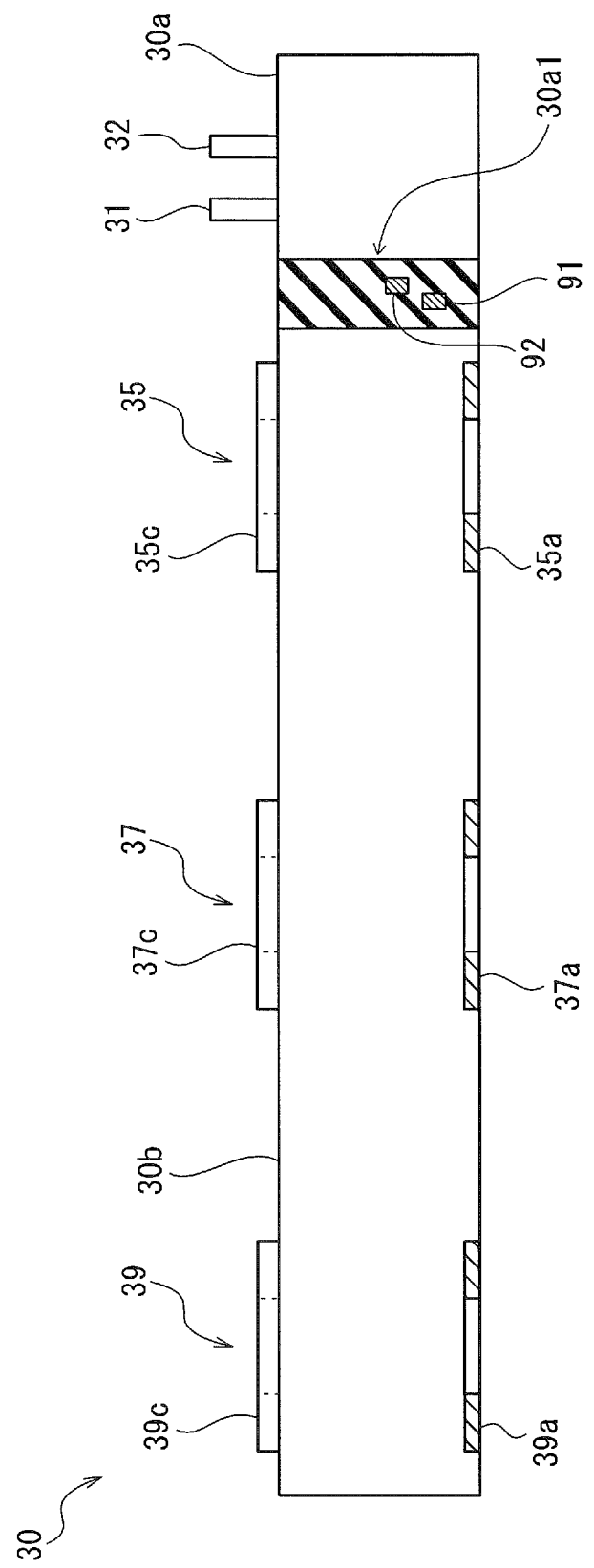
FIG. 11 is a cross-sectional view taken along the line C-C of FIG. 7.
Figure 12:
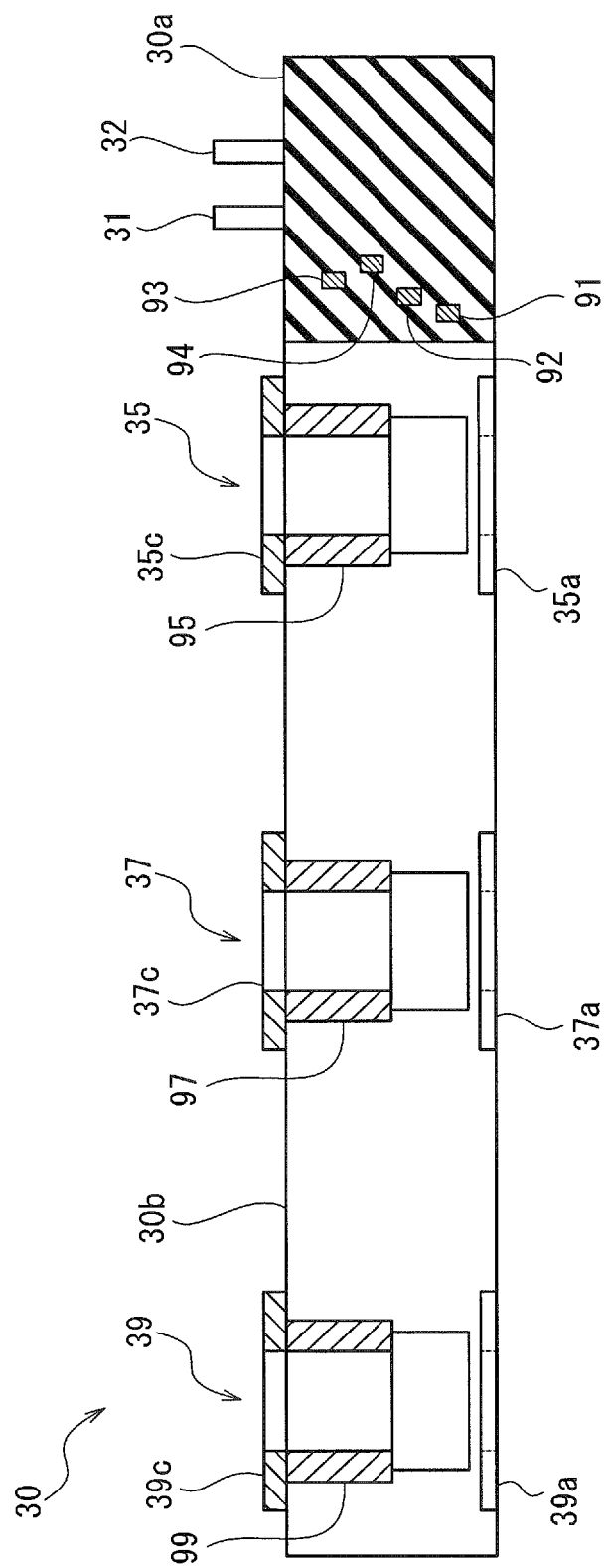
FIG. 12 is a cross-sectional view taken along the line D-D of FIG. 7.

As illustrated in FIGS. 8 and 11, the collector external connecting portion 35c, the emitter external connecting portion 37c, and the output external connecting portion 39c are exposed and provided above the top surface of the supporting portion 30b. As illustrated in FIGS. 11 and 12, through-holes for connecting to an external apparatus are provided at the centers of the main surfaces of the collector external connecting portion 35c, the emitter external connecting portion 37c, and the output external connecting portion 39c, respectively. As illustrated in FIG. 11, through-holes for connecting to the semiconductor units 10, 20 are provided at the centers of the main surfaces of the collector bus bar connecting portions 35a, 35b, respectively. As illustrated in FIG. 8, in the collector main-terminal connecting bar 35, each of regions which are located between the collector bus bar connecting portions 35a, 35b and the collector external connecting portion 35c respectively, extends in the vertical direction, and implements the side-wall. The side-walls are buried in the resin of the main body of the supporting portion 30b and are integrally fixed with the supporting portion 30b.

As illustrated in FIG. 7, similarly to the collector main-terminal connecting bar 35, the emitter bus bar connecting portions 37a, 37b are provided at the left and right ends of the emitter main-terminal connecting bar 37 respectively and the emitter external connecting portion 37c is provided at the center of the emitter main-terminal connecting bar 37. In addition, the output bus bar connecting portions 39a, 39b are provided at the left and right ends of the output main-terminal connecting bar 39 and the output external connecting portion 39c is provided at the center of the output main-terminal connecting bar 39, respectively. Each of the emitter main-terminal connecting bar 37 and the output main-terminal connecting bar 39 has the same structure as the collector main-terminal connecting bar 35, respectively and the duplicate description will be omitted. As illustrated in FIG. 12, in the main body of the supporting portion 30b, spaces for nut gloves which accommodate nuts 95, 97, and 99 are provided below the collector main-terminal connecting bar 35, the emitter main-terminal connecting bar 37, and the output main-terminal connecting bar 39 respectively.

<Method for Manufacturing Semiconductor Device>

Figure 13:
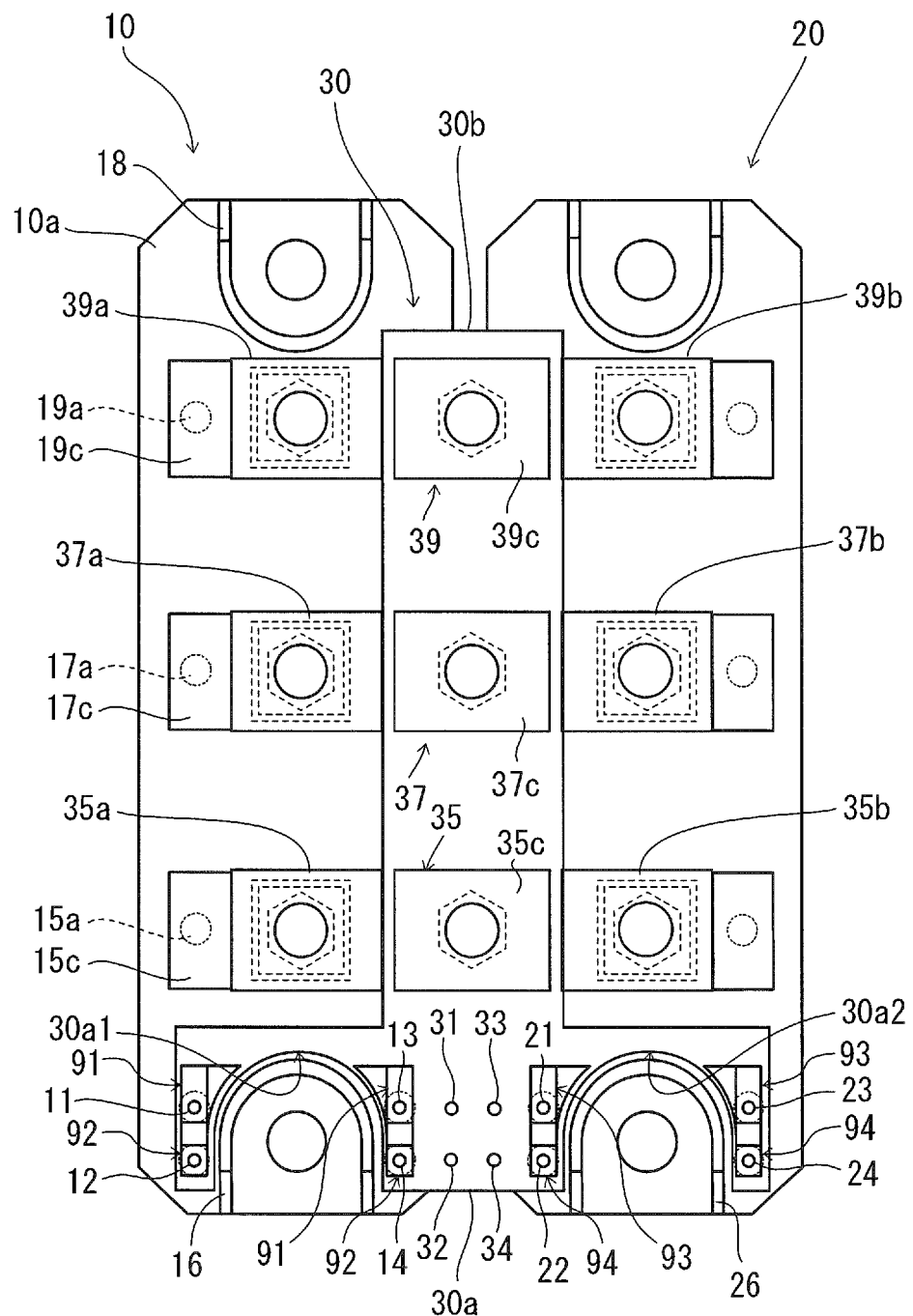
FIG. 13 is a plan view schematically illustrating the outline of the structure of the semiconductor device according to the embodiment of the present invention, in which the interface unit connects the pair of semiconductor units in parallel.

Next, a method for manufacturing the semiconductor device according to the embodiment of the present invention, in which the interface unit 30 is used, will be described. First, two semiconductor units 10, 20 which implement a pair are bonded side by side on the base plate 100. Then, as illustrated in FIG. 13, the interface unit 30 is mounted on the top surfaces of the pair of semiconductor units 10, 20, at the center of the direction along which two semiconductor units 10, 20 are arranged side by side in the arrangement direction of the semiconductor units 10, 20, such that the longitudinal direction of the supporting portion 30b is aligned with the longitudinal direction of the semiconductor units 10, 20. The interface unit 30 is mounted such that the cutouts 30a1, 30a2 of the accommodating portion 30a are fitted to the outer edge of the skirt 16 and the outer edge of the skirt on the sealing resin of the semiconductor unit 20 on the sealing resin 10a of the semiconductor unit 10. In the interface unit 30, the central axis of the supporting portion 30b in the longitudinal direction is aligned with the center of the gap between the pair of semiconductor units 10, 20, and the width of overlapping portion between one end of the accommodating portion 30a and the semiconductor unit 10, and the width of overlapping portion between another end of the accommodating portion 30a and the semiconductor unit 20, are equal to each other. That is, the semiconductor device is bilaterally symmetric in a plane pattern.

Then, the collector bus bar connecting portions 35a, 35b at each of both ends of the collector main-terminal connecting bar 35 in the supporting portion 30b of the interface unit 30 are bonded to both the collector bus bar terminal 15c of the semiconductor unit 10 and the collector bus bar terminal of the semiconductor unit 20 disposed below the interface unit 30 by soldering etc., respectively. In addition, hole portions of the collector main-terminal connecting bar 35 and the collector bus bar terminal 15c overlap each other and the collector main-terminal connecting bar 35 and the collector bus bar terminal 15c are fixed by a screw.

Similarly, the emitter bus bar connecting portions 37a, 37b at each of both ends of the emitter main-terminal connecting bar 37 of the supporting portion 30b are bonded to both the emitter bus bar terminal 17c of the semiconductor unit 10 and the emitter bus bar terminal of the semiconductor unit 20 below the interface unit 30 by soldering etc., respectively. In addition, hole portions of the emitter main-terminal connecting bar 37 and the emitter bus bar terminal 17c overlap each other and the emitter main-terminal connecting bar 37 and the emitter bus bar terminal 17c are fixed by a screw. The output bus bar connecting portions 39a, 39b at each of both ends of the output main-terminal connecting bar 39 of the supporting portion 30b are bonded to both the output bus bar terminal 19c of the semiconductor unit 10 and the output bus bar terminal of the semiconductor unit 20 below the interface unit 30 by soldering etc., respectively. In addition, hole portions of the output main-terminal connecting bar 39 and the output bus bar terminal 19c overlap each other and the output main-terminal connecting bar 39 and the output bus bar terminal 19c are fixed by a screw.

Figure 14:
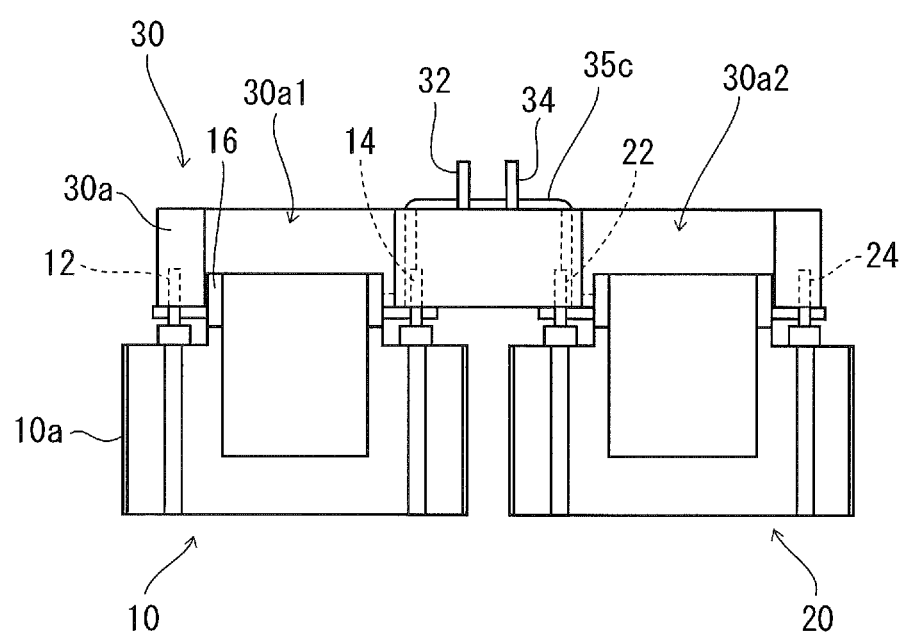
FIG. 14 is a side view schematically illustrating the outline of the structure of the semiconductor device according to the embodiment of the present invention, in which the interface unit connects the pair of semiconductor units in parallel. The longer-side of the accommodating portion of the interface unit is illustrated on the front of FIG. 14, so as to measure the height of the interface unit.

Next, the connecting between control terminals of the pair of semiconductor units 10, 20 and the internal wirings corresponding to the control terminals in the accommodating portion 30a will be described in detail with reference to FIG. 14, FIG. 10A, and FIG. 10B in addition to FIG. 13. First, as illustrated in FIG. 10B, the upper-arm emitter-signal terminal 11 of the semiconductor unit 10 is inserted into both the through-hole provided in the lower part of the accommodating portion 30a and the through-hole provided at the end of the left branch portion 91b of the first emitter-signal internal wiring 91 in the accommodating portion 30a, and is integrated with the left branch portion 91b. The upper-arm emitter-signal terminal 11 and the end of the left branch portion 91b of the first emitter-signal internal wiring 91 which are integrated with each other are exposed on the lower stage of the step, which is illustrated at the upper-side in the concave portion in FIG. 13, the concave portion is provided on the left side of the left cutout 30a1 of the accommodating portion 30a positioned in FIG. 13. The upper-arm emitter-signal terminal 11 and the end of the first emitter-signal internal wiring 91 are electrically connected to each other inside the exposed concave portion by a process such as a welding, caulking, or using a bonding material like solder, against a fixing portion between the upper-arm emitter-signal terminal 11 and the first emitter-signal internal wiring 91.

The left-side gate-signal terminal 12 of the semiconductor unit 10 illustrated in FIG. 10A is inserted into both the through-hole provided in the lower part of the accommodating portion 30a and the through-hole provided at the end of the left branch portion (92b1, 92b2) of the first gate-signal internal wiring 92 in the accommodating portion 30a, and is integrated with the left branch portion. The left-side gate-signal terminal 12 and the end of the left branch portion (92b1, 92b2) of the first gate-signal internal wiring 92 which are integrated with each other are exposed on the upper stage of the step, which is illustrated at the lower-side in the concave portion in FIG. 13, the concave portion is positioned on the left side of the left cutout 30a1 of the accommodating portion 30a illustrated in FIG. 13. The left-side gate-signal terminal 12 and the end of the first gate-signal internal wiring 92 are electrically connected to each other inside the exposed concave portion by a process such as a welding, caulking, or using a bonding material like solder, against a fixing portion between the left-side gate-signal terminal 12 and the first gate-signal internal wiring 92.

Similarly, the upper end of the lower-arm emitter-signal terminal 13 of the semiconductor unit 10 and the end of the left branch portion of the second emitter-signal internal wiring 93 are integrated to implement a bonding site. Then, the bonding site are electrically connected to each other on the lower stage of the step, which is illustrated at the upper-side in the concave portion in FIG. 13, the concave portion is positioned on the right side of the left cutout 30a1 of the accommodating portion 30a illustrated in FIG. 13. In addition, the upper end of the right-side gate-signal terminal 14 of the semiconductor unit 10 and the end of the left branch portion of the second gate-signal internal wiring 94 are integrated to implement a bonding site. Then, the ends forming the bonding site are electrically connected to each other on the upper stage of the step, which is illustrated at the lower-side in the concave portion in FIG. 13, the concave portion is positioned on the right side of the left cutout 30a1 of the accommodating portion 30a illustrated in FIG. 13.

For the semiconductor unit 20 which implements a pair together with the semiconductor unit 10, the upper-arm emitter-signal terminal 21 is inserted into both the through-hole provided in the lower part of the accommodating portion 30a and the through-hole provided at the end of the right branch portion of the first emitter-signal internal wiring 91 in the accommodating portion 30a, and is integrated with the end of the right branch portion. The upper-arm emitter-signal terminal 21 and the end of the right branch portion of the first emitter-signal internal wiring 91 which are integrated with each other are exposed on the lower stage of the step, which is illustrated at the upper-side in the concave portion in FIG. 13, the concave portion is positioned on the left side of the right cutout 30a2 of the accommodating portion 30a illustrated in FIG. 13. Then, the upper-arm emitter-signal terminal 21 and the end of the first emitter-signal internal wiring 91 are electrically connected to each other in the exposed concave portion by a process such as a welding, caulking, or using a bonding material like solder, against a fixing portion between the upper-arm emitter-signal terminal 21 and the first emitter-signal internal wiring 91.

The left-side gate-signal terminal 22 of the semiconductor unit 20 is inserted into both the through-hole provided in the lower part of the accommodating portion 30a and the through-hole provided at the end of the right branch portion of the first gate-signal internal wiring 92 in the accommodating portion 30a, and is integrated with the end of the right branch portion. The left-side gate-signal terminal 22 and the end of the right branch portion of the first gate-signal internal wiring 92 which are integrated with each other are exposed on the upper stage of the step, which is illustrated at the lower-side in the concave portion in FIG. 13, the concave portion is positioned on the left side of the right cutout 30a2 of the accommodating portion 30a illustrated in FIG. 13. Then, the left-side gate-signal terminal 22 and the end of the right branch portion of the first gate-signal internal wiring 92 are electrically connected to each other in the exposed concave portion by a process such as a welding, caulking, or using a bonding material like solder, against a fixing portion between the left-side gate-signal terminal 22 and the first gate-signal internal wiring 92.

Similarly, the upper end of the lower-arm emitter-signal terminal 23 of the semiconductor unit 20 and the end of the right branch portion of the second emitter-signal internal wiring 93 are integrated to implement a bonding site. Then, the bonding site are electrically connected to each other on the lower stage of the step, which is illustrated at the upper-side in the concave portion in FIG. 13, the concave portion is positioned on the right side of the right cutout 30a2 of the accommodating portion 30a illustrated in FIG. 13. In addition, the upper end of the right-side gate-signal terminal 24 of the right semiconductor unit 20 and the end of the right branch portion of the second gate-signal internal wiring 94 are integrated to implement a bonding site. Then, the bonding site are electrically connected to each other on the upper stage of the step, which is illustrated at the lower-side in the concave portion in FIG. 13, the concave portion is positioned on the right side of the right cutout 30a2 of the accommodating portion 30a illustrated in FIG. 13.

Finally, as illustrated in FIG. 10A, the upper-arm emitter-signal terminals 11, 21 included in the pair of semiconductor units 10, 20 are connected to each other by the left branch portion 91b and the right branch portion 91c of the first emitter-signal internal wiring 91 in the accommodating portion 30a. In addition, the upper-arm emitter-signal terminals 11, 21 are electrically connected to the first emitter-signal terminal 31 which extends upward outside the accommodating portion 30a through the central branch portion 91d, which is connected to the left branch portion 91b and the right branch portion 91c.

The left-side gate-signal terminals 12, 22 included in the pair of semiconductor units 10, 20 are connected to each other by the left branch portion (92b1, 92b2) and the right branch portion (92c1, 92c2) of the first gate-signal internal wiring 92 in the accommodating portion 30a. In addition, the left-side gate-signal terminals 12, 22 are electrically connected to the first gate-signal terminal 32 which extends upward outside the accommodating portion 30a through the central branch portion (92d1, 92d2), which is connected to the left branch portion (92b1, 92b2) and the right branch portion (92c1, 92c2).

The lower-arm emitter-signal terminals 13, 23 included in the pair of semiconductor units 10, 20 are connected to each other by the left branch portion and the right branch portion of the second emitter-signal internal wiring 93 in the accommodating portion 30a. In addition, the lower-arm emitter-signal terminals 13, 23 are electrically connected to the second emitter-signal terminal 33 which extends upward outside the accommodating portion 30a through the central branch portion, which is connected to the left branch portion and the right branch portion of the second emitter-signal internal wiring 93.

The right-side gate-signal terminals 14, 24 included in the pair of semiconductor units 10, 20 are connected to each other by the left branch portion and the right branch portion of the second gate-signal internal wiring 94 in the accommodating portion 30a. In addition, the right-side gate-signal terminals 14, 24 are electrically connected to the second gate-signal terminal 34 which extends upward outside the accommodating portion 30a through the central branch portion, which is connected to the left branch portion and the right branch portion of the second gate-signal internal wiring 94. FIG. 14 illustrates a state in which the left-side gate-signal terminal 12 and the right-side gate-signal terminal 14 of the semiconductor unit 10 and the left-side gate-signal terminal 22 and the right-side gate-signal terminal 24 of the semiconductor unit 20 are inserted into the accommodating portion 30a and are integrated with the accommodating portion 30a.

Figure 15:
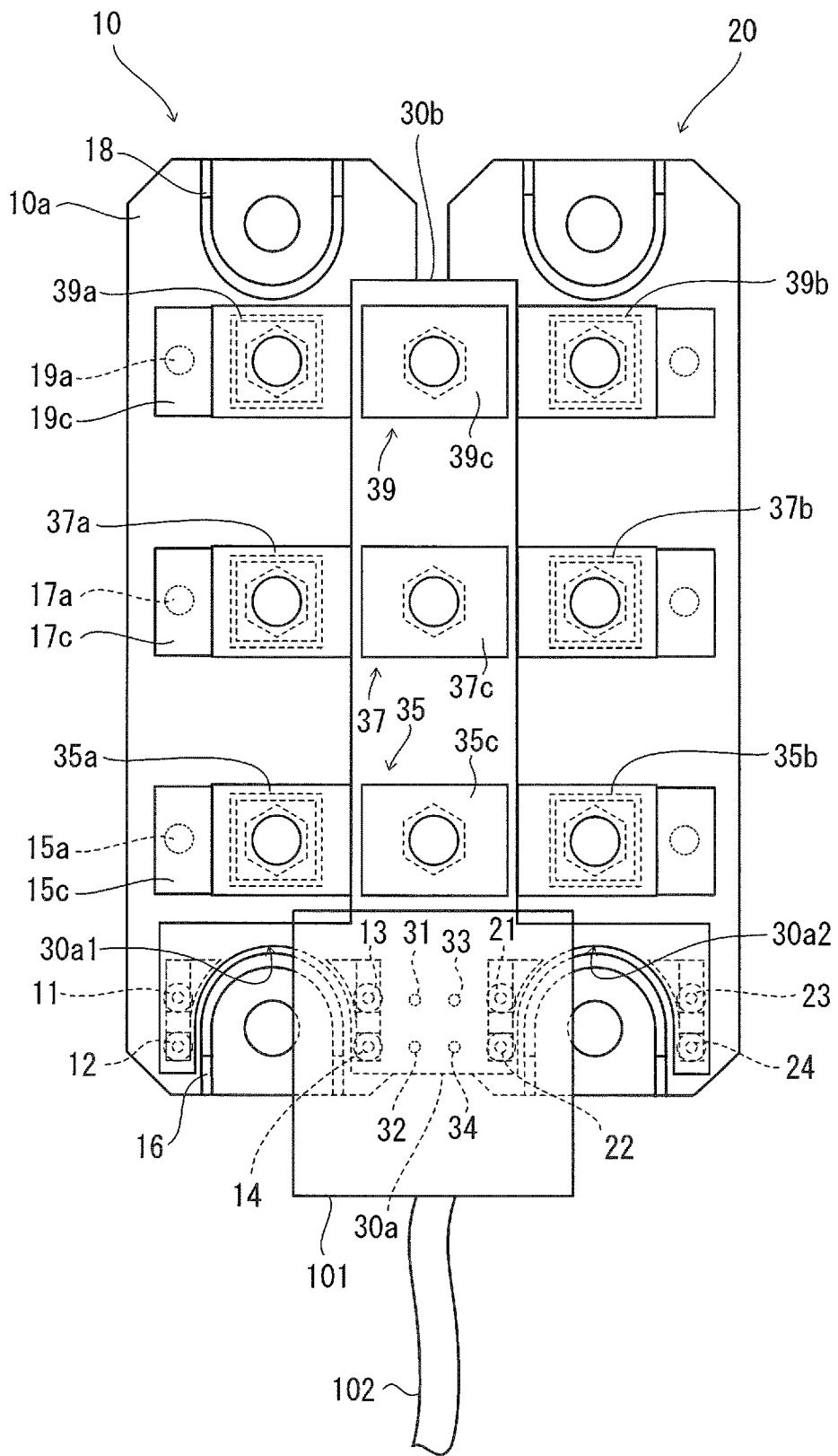
FIG. 15 is a plan view schematically illustrating the outline of a structure of the semiconductor device according to the embodiment of the present invention, in which the pair of semiconductor units connected in parallel to each other and the pair of semiconductor units is connected to a control printed-circuit-board of an external apparatus through the interface unit.

The semiconductor device according to the embodiment of the present invention can be obtained by the above-mentioned series of processes. Then, as illustrated in FIG. 15, the semiconductor device is connected to an external apparatus such that a main surface of a control printed-circuit-board 101 which is connected to the external apparatus by a wiring 102 overlaps a flat outer surface of the accommodating portion 30a of the interface unit 30. The control printed-circuit-board 101 includes regions which are connected to each upper end of the first emitter-signal terminal 31, the first gate-signal terminal 32, the second emitter-signal terminal 33, and the second gate-signal terminal 34 extending from the accommodating portion 30a, respectively. However, hole portions into which each upper end of the first emitter-signal terminal 31, the first gate-signal terminal 32, the second emitter-signal terminal 33, and the second gate-signal terminal 34 are inserted may be provided in the main surface of the control printed-circuit-board 101 and may be used for connecting. Due to the connecting, paths are implemented among the main terminals and the unit-side control terminals extending from the semiconductor unit 10 of the semiconductor device respectively, the internal wirings and the external-connecting control terminals provided in the accommodating portion 30a of the interface unit 30, the control printed-circuit-board 101, and the external apparatus. It is possible for a main current and a control signal to pass through the paths.

Comparative Example

Figure 16:
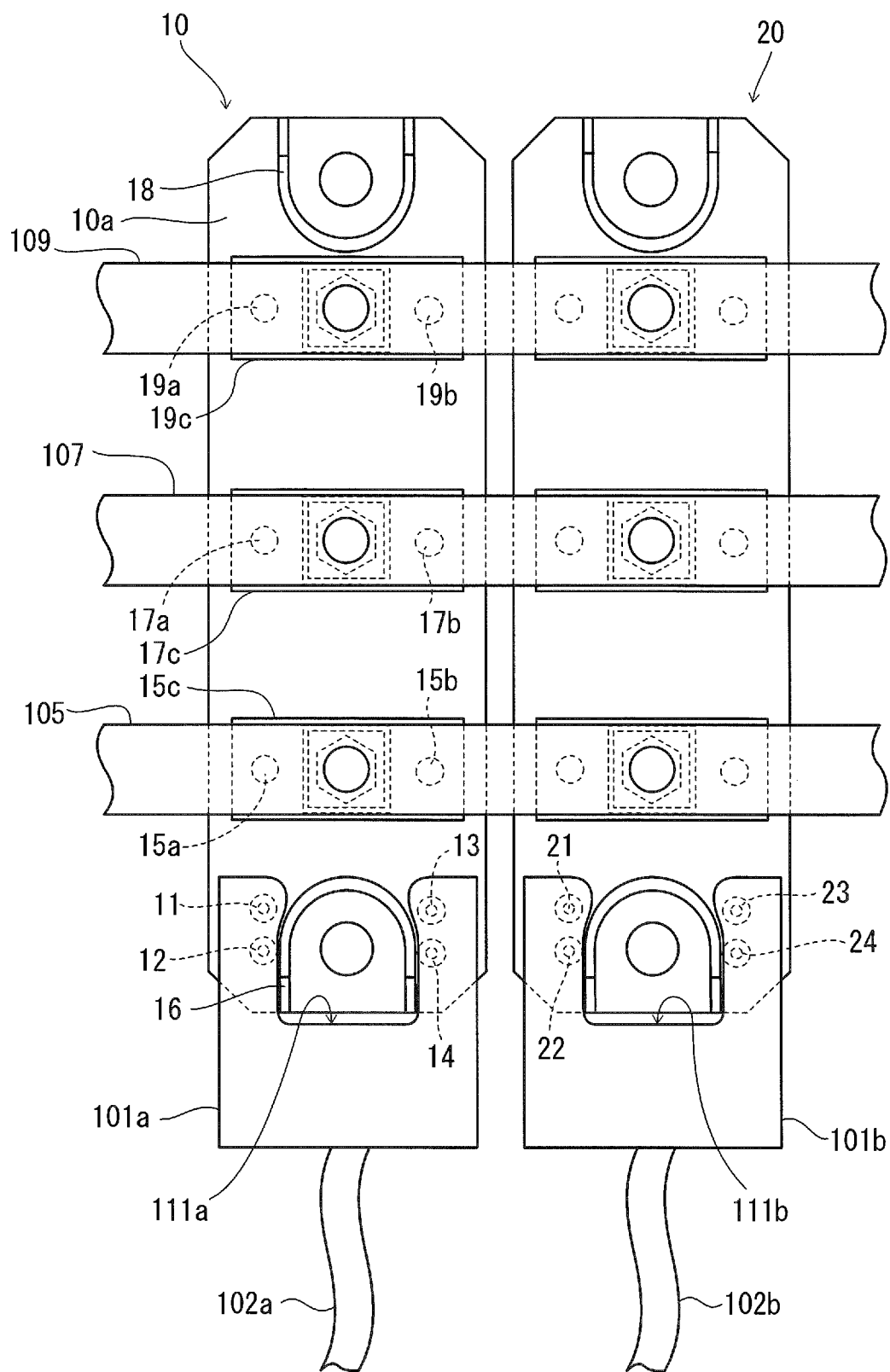
FIG. 16 is a plan view schematically illustrating the outline of a structure of a semiconductor device according to a comparative example, in which each of a pair of semiconductor units connected in parallel to each other, the pair of semiconductor units is connected to a control printed-circuit-board of an external apparatus.

In the case of a semiconductor device according to a comparative example illustrated in FIG. 16, a pair of semiconductor units 10, 20 are connected in parallel to each other by three bus bar wirings, that is, a collector bus bar wiring 105, an emitter bus bar wiring 107, and an output bus bar wiring 109, through the interface unit 30. The semiconductor device including the pair of semiconductor units 10, 20 which are connected in parallel to each other is connected to an external apparatus by two control printed-circuit-boards 101a and 101b which correspond to the pair of semiconductor units 10, 20, respectively. As illustrated in FIG. 16, the semiconductor device according to the comparative example requires a total of five connecting members, which are the collector bus bar wiring 105, the emitter bus bar wiring 107, the output bus bar wiring 109 and two control printed-circuit-boards 101a and 101b. In addition, it takes time and effort to attach each of the five connecting members to the semiconductor units 10, 20.

Each of wirings 102a and 102b which are connected to the control printed-circuit-boards 101a and 101b, respectively, includes four wirings through which an upper-arm emitter signal, a left gate signal, a lower-arm emitter signal, and a right gate signal of the semiconductor units 10, 20 flow. Therefore, each of the wirings 102a and 102b inevitably requires a thickness which is equal to or greater than a predetermined value even for a single wiring. In addition, for example, in some cases, each of the wirings 102a and 102b has a length of one meter or more, depending on the specifications of an external apparatus and a semiconductor device which are connected to each other. Therefore, a large amount of burden exists in the operation of arranging the wirings 102a and 102b and it is necessary to ensure enough space to accommodate the wirings 102a and 102b inside between the semiconductor device and the external apparatus which are connected to each other.

Here, a case in which the semiconductor units 10, 20 have the skirts 16, 18 which protrude upward from the sealing resin 10a as illustrated in FIG. 16 is examined. The skirt 16 illustrated on the lower side in FIG. 16 is provided in the vicinity of the upper-arm emitter-signal terminals 11, 21, the left-side gate-signal terminals 12, 22, the lower-arm emitter-signal terminals 13, 23, and the right-side gate-signal terminals 14, 24. Therefore, an additional structure such as cutout portions 111a and 111b illustrated in FIG. 16 is needed in the control printed-circuit-boards 101a and 101b which are connected to above-mentioned control terminals, so as to avoid the interference between the control printed-circuit-boards 101a and 101b and the skirt 16.

In the interface unit 30 of the semiconductor device according to the embodiment of the present invention, the collector main-terminal connecting bar 35, the emitter main-terminal connecting bar 37, and the output main-terminal connecting bar 39 are integrally supported by the supporting portion 30b. In addition, the first emitter-signal internal wiring 91, the first gate-signal internal wiring 92, the second emitter-signal internal wiring 93, and the second gate-signal internal wiring 94 are integrally supported in the accommodating portion 30a.

Therefore, the operator can easily connect the semiconductor device to the external apparatus only by holding one interface unit 30 and placing the interface unit 30 at a predetermined position on the semiconductor units 10, 20. In addition, even when the pair of semiconductor units 10, 20 are provided with a plurality of main terminals and a plurality of control terminals, it is possible to arrange each position and the external apparatus for connecting to each other easily and in high operability, by use of the interface unit 30. Therefore, the interface unit 30 has high advantage in handleability as a connecting member. As a result, it is possible to reduce a burden in an assembling operation and to increase mass productivity of the semiconductor device. In addition, according to the embodiment of the present invention, operation of disassembling the semiconductor device, for example, during maintenance can be implemented easily and in high operability.

In the interface unit 30 of the semiconductor device according to the embodiment of the present invention, since the internal wirings for control signals are accommodated in the box-shaped accommodating portion 30a, the internal wirings are reliably protected. In addition, the collector main-terminal connecting bar 35, the emitter main-terminal connecting bar 37, and the output main-terminal connecting bar 39 for the main current are fixed firmly attached to the side-walls of the supporting portion 30b. The entire interface unit 30 has high strength and high reliability as a bonding member. Therefore, even when the interface unit 30 unexpectedly contacts with other members during a bonding operation or external force is applied to the interface unit 30, it is possible to prevent the internal wirings and the main-terminal connecting bars from being damaged.

In the case of the semiconductor device according to the embodiment of the present invention, as illustrated in FIG. 15, the pair of semiconductor units 10, 20 are bilaterally symmetric with respect to the center of the interface unit 30. In addition, the connection structure between the pair of semiconductor units 10, 20 and the collector main-terminal connecting bar 35, the emitter main-terminal connecting bar 37, and the output main-terminal connecting bar 39 in the supporting portion 30b of the interface unit 30 is bilaterally symmetric with respect to the center of the supporting portion 30b. Furthermore, the internal wirings in the accommodating portion 30a are provided so as to be bilaterally symmetric or to be close to bilateral symmetry in a plane pattern. Therefore, it is possible to implement a semiconductor device in which the wiring inductance of the main current and the control signal flowing between the pair of semiconductor units 10, 20 and the interface unit 30 is lowered such that a loss is reduced.

In addition, as illustrated in FIG. 1 etc., the arc-shaped skirts 16 are provided in the semiconductor units 10, 20 with protruding upward, and the arc-shaped cutouts 30a1, 30a2 are provided in the accommodating portion 30a in order to avoid interference with the skirts 16. In some cases, it is necessary to partially reduce the width of the accommodating portion 30a in the direction of the shorter-side so as to form a small region, in corresponding to the shape of the arc. However, in the interface unit 30 of the semiconductor device according to the embodiment of the present invention, as illustrated in FIGS. 10B and 11, a plurality of internal wirings are compactly stacked inside the accommodating portion 30a in the vertical direction, using the thickness of the accommodating portion 30a in the up-down direction. Therefore, it is possible to reliably arrange the internal wirings even inside a small region formed in the accommodating portion 30a.

In the case of the semiconductor device according to the embodiment of the present invention, since both the main current and the control signal is transmitted between the semiconductor device and an external apparatus by just one interface unit 30, it is possible to prevent an increase in the number of connecting members used between the semiconductor device and the external apparatus. Therefore, a space for accommodating the connecting members between the semiconductor device and the external apparatus which are connected to each other is reduced. In addition, it is possible to draw wirings between the semiconductor device and the external apparatus very simply. As a result, it is possible to improve flexibility in the design of an external apparatus and to reduce costs.

In the accommodating portion 30a of the interface unit 30 used to bond an external apparatus to the semiconductor device according to the embodiment of the present invention, two concave portions are provided on both sides of each of two cutouts 30a1, 30a2, respectively. That is, a total of four concave portions are provided. In the four concave portions, the ends of three branches of each of the first emitter-signal internal wiring 91, the first gate-signal internal wiring 92, the second emitter-signal internal wiring 93, and the second gate-signal internal wiring 94 are exposed. In the method for manufacturing the semiconductor device according to the embodiment of the present invention, since the bonding sites are exposed through the concave portions of the interface unit 30, it is possible to connect each upper end of the control terminals in the semiconductor device and the internal wirings, effectively in the exposed space, using a welding material, caulking, or solder.

In the semiconductor device according to the embodiment of the present invention, each of the first emitter-signal terminal 31, the first gate-signal terminal 32, the second emitter-signal terminal 33, and the second gate-signal terminal 34 are closely arranged on the flat outer top surface of the accommodating portion 30a. Therefore, when the terminals overlap the control printed-circuit-board 101, it is possible to implement electrical connecting to all of the first emitter-signal terminal 31, the first gate-signal terminal 32, the second emitter-signal terminal 33, and the second gate-signal terminal 34, by using only one sheet of control printed-circuit-board which has connecting portions corresponding to above-mentioned terminals.

First Modification Example

Figure 17:
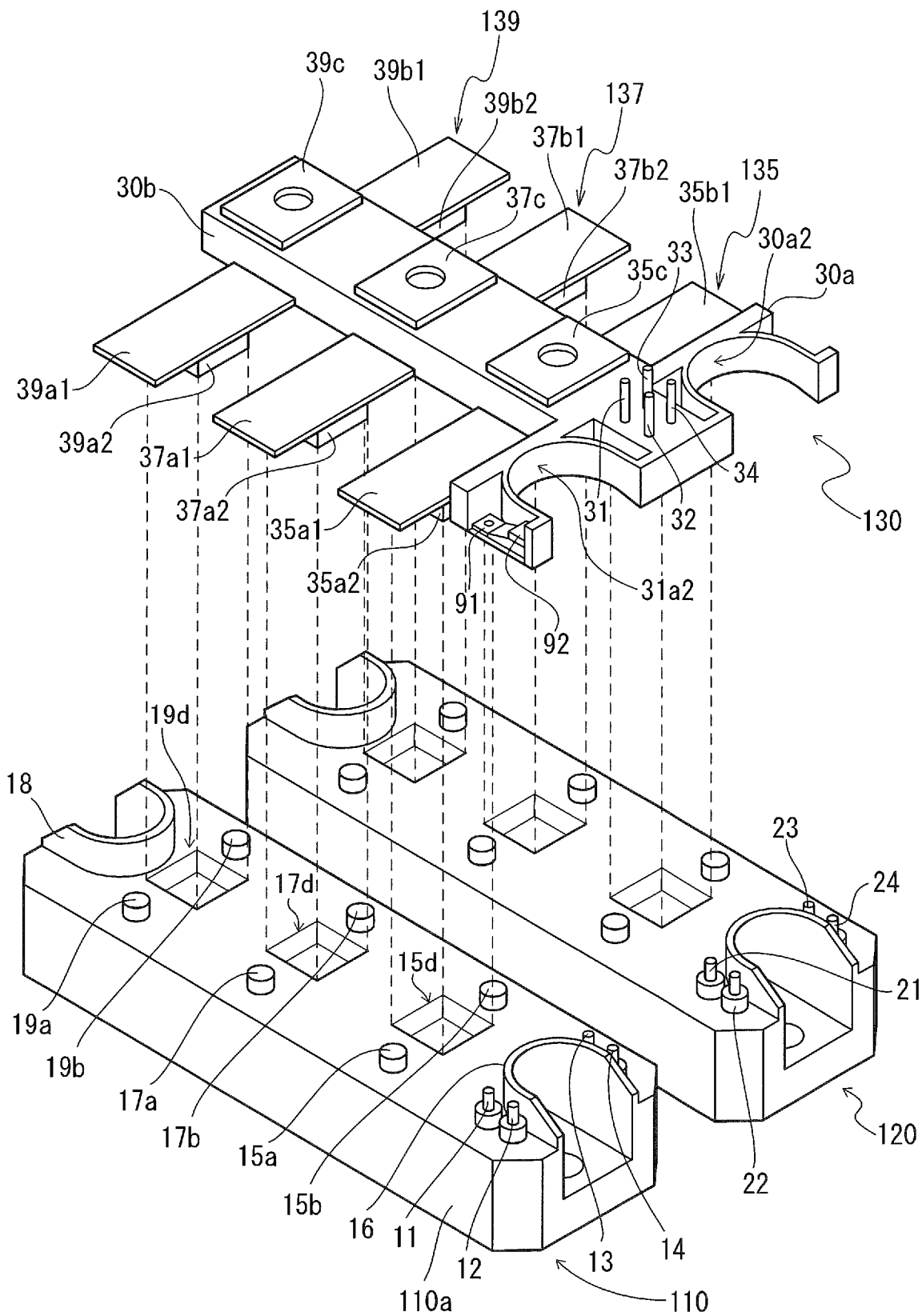
FIG. 17 is an exploded perspective view schematically illustrating the outline of the structure of a semiconductor device according to a first modification example of the embodiment of the present invention.

FIG. 17 illustrates another example of the connection structure between the interface unit and the main terminals of a pair of semiconductor units. As illustrated in FIG. 17, convex portion which protrude toward the semiconductor units 110, 120 below the interface unit may be provided on the bottom surfaces of both ends of each of a collector main-terminal connecting bar 135, an emitter main-terminal connecting bar 137, and an output main-terminal connecting bar 139 of the interface unit 130. In addition, concave portions with a shape into which the convex portions can be fitted may be provided at positions corresponding to the convex portions of the interface unit 130 on the top surfaces of the sealing resins 10a of the pair of semiconductor units 110, 120.

FIG. 17 illustrates plate-shaped collector bus bar connecting portions 35a1 and 35b1 which are provided at each of both ends of the collector main-terminal connecting bar 135, and illustrates a collector fitting convex-portion 35a2 which is provided on the bottom surface of the collector bus bar connecting portion 35a1. However, an output fitting convex-portion which is provided on the bottom surface of the output bus bar connecting portion 35b1 located on the rear side in FIG. 17 is not illustrated. Similarly, plate-shaped emitter bus bar connecting portions 37a1, 37b1 are provided at each of both ends of the emitter main-terminal connecting bar 137, and illustrates emitter fitting convex-portions 37a2, 37b2 are provided on the bottom surfaces of the emitter bus bar connecting portions 37a1, 37b1, respectively. In addition, plate-shaped output bus bar connecting portions 39a1, 39b1 are provided at each of both ends of the output main-terminal connecting bar 139, and illustrates output fitting convex-portions 39a2 and 39b2 are provided on the bottom surfaces of the output bus bar connecting portions 39a1, 39b1, respectively.

A collector fitting concave-portion 15d, an emitter fitting concave-portion 17d, and an output fitting concave-portion 19d are provided in the top surface of the sealing resin 110a of the semiconductor unit 110 so as to correspond to the collector fitting convex-portion 35a2, the emitter fitting convex-portion 37a2, and the output fitting convex-portion 39a2 illustrated on the front side in FIG. 17, respectively. Similarly, a collector fitting concave-portion, an emitter fitting concave-portion, and an output fitting concave-portion are provided in the top surface of the sealing resin of the semiconductor unit 20 so as to correspond to the collector fitting convex-portion, the emitter fitting convex-portion 37b2, and the output fitting convex-portion 39b2 illustrated on the rear side in FIG. 17, respectively. Since the other structures of the interface unit 130 according to the first modification example are the same as the structure of the interface unit 30 illustrated in FIG. 1, the duplicate description will be omitted.

According to the semiconductor device of the first modification example, it is possible to implement a semiconductor device having the semiconductor units which are connected in parallel to each other only by overlapping the interface unit 130 with the pair of semiconductor units 110, 120 and fitting the convex portions to the corresponding concave portions. Therefore, a connecting operation is simply achieved and the burden in the connecting operation is reduced. In addition, it is not necessary to provide the collector bus bar terminal 15c, the emitter bus bar terminal 17c, and the output bus bar terminal 19c as illustrated in FIG. 1, on the semiconductor units 110, 120. Therefore, it is possible to reduce the number of members in the semiconductor units 110, 120 and to prevent an increase in cost. The other effectiveness of the semiconductor device according to the first modification example are the same as the effectiveness of the semiconductor device illustrated in FIGS. 1 to 15. As for the fitting convex and concave portions, the concave portions may be provided in the upper interface unit 130 in the upper side and the convex portions may be provided on the lower semiconductor unit 110 in the lower side. In addition, the positions of the fitting convex or concave portions, which are provided in the interface unit 130 so as to correspond to the semiconductor units 110, 120 are not limited to the bottom surfaces of the main-terminal connecting bars, and other positions such as the bottom surface of the supporting portion 30b is available.

Second Modification Example

Figure 18:
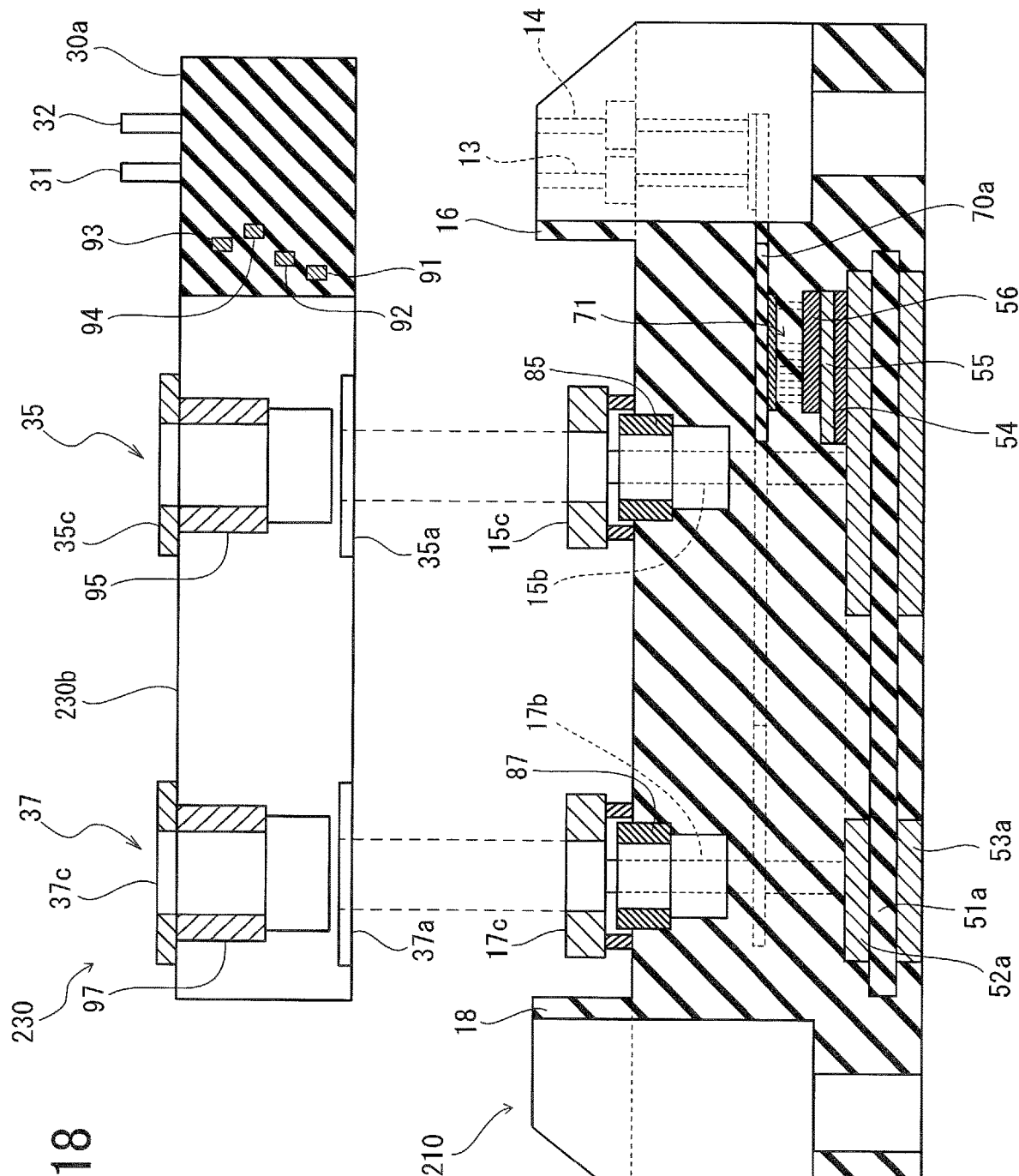
FIG. 18 is an exploded cross-sectional view schematically illustrating the outline of the structure of a semiconductor device according to a second modification example of the embodiment of the present invention.

The semiconductor unit used in the semiconductor device according to the present invention is not limited to the 2in1-type semiconductor unit and may be a so-called "1in1-type" semiconductor unit including only one semiconductor module. As illustrated in FIG. 18, an interface unit 230 according to a second modification example of the embodiment of the present invention can also be connected to a 1in1-type semiconductor unit 210 without including an output-side terminal. A supporting portion 230b of the interface unit 230 according to the second modification example does not include the output main-terminal connecting bar 39 illustrated in FIG. 1 and includes only the collector main-terminal connecting bar 35 and the emitter main-terminal connecting bar 37. In addition, the semiconductor module including an insulating layer 51a, a top-surface conductive layer 52a and a bottom-surface conductive layer 53a is provided in the semiconductor unit 210. The semiconductor module is connected to the collector main-terminal connecting bar 35 through a collector connection terminal 15b, and is connected to the emitter main-terminal connecting bar 37 through an emitter connection terminal 17b. Since the other structures of the interface unit 230 according to the second modification example are the same as the structure of the interface unit 30 illustrated in FIG. 1, the duplicate description will be omitted. The other effectiveness of the semiconductor device according to the second modification example are the same as the effectiveness of the semiconductor device illustrated in FIGS. 1 to 15.

Third Modification Example

Figure 19:
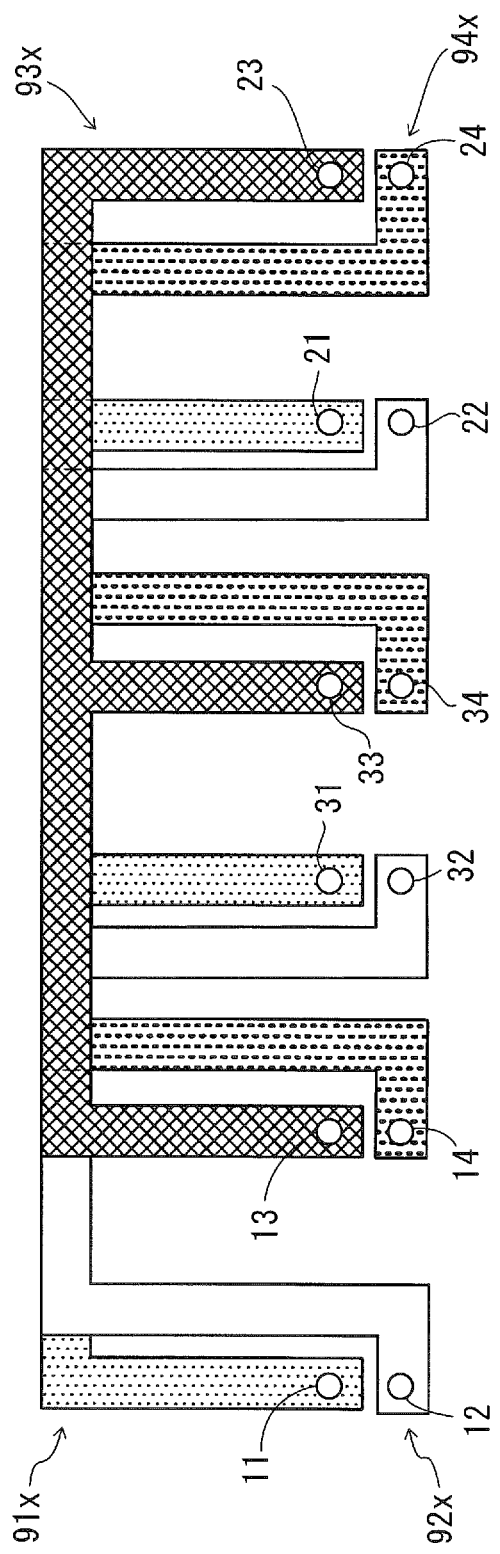
FIG. 19 is a plan view schematically illustrating the outline of the stacking-state of internal wirings of an accommodating portion of an interface unit used in a semiconductor device according to a third modification example of the embodiment of the present invention.

The arrangement pattern of the internal wirings in the accommodating portion of the interface unit used in the semiconductor device according to the present invention is not limited to the arrangement pattern illustrated in FIG. 10A and may be appropriately changed. For example, as illustrated in FIG. 19, all of the base portions which extend in the left-right direction in a first emitter-signal internal wiring 91x, a first gate-signal internal wiring 92x, a second emitter-signal internal wiring 93x, and a second gate-signal internal wiring 94x may be arranged on the same straight line so as to overlap each other in a plane pattern. Since the other structures of the interface unit according to the third modification example except the arrangement pattern of the internal wirings are the same as the structure of the interface unit 30 illustrated in FIG. 1, the duplicate description will be omitted.

In the semiconductor device according to the third modification example, all of the base portions of a plurality of internal wirings are arranged so as to overlap each other, in a direction along which the internal wirings are stacked. Therefore, it is possible to further reduce the width of the accommodating portion for the space to be required to dispose the base portions. As a result, it is possible to further improve flexibility in the design of the interface unit. The other effectiveness of the semiconductor device according to the third modification example is the same as the effectiveness of the semiconductor device illustrated in FIGS. 1 to 15.

Other Embodiments

The present invention has been described with reference to the above-mentioned embodiments. However, it will be understood that the description and the drawings forming a portion of the disclosure do not limit the present invention. It will be apparent to those skilled in the art that various modifications, embodiments, and application techniques of the present disclosure can be made. For example, as a semiconductor element which is a semiconductor chip, various semiconductor elements may be used as long as they can be used in semiconductor modules such as an IGBT, a MOSFET, and a diode.

In the above-described embodiment of the present invention, a pair of semiconductor modules is implemented by two semiconductor modules. However, the number of semiconductor modules included in the pair of semiconductor modules is not limited to two, and may be two or more. For example, when a so-called 6in1-type semiconductor device in which six semiconductor modules are arranged in parallel to each other is implemented, six semiconductor modules are classified into two sets each of which includes three semiconductor modules, and the two sets of semiconductor modules can be regarded as the pair of semiconductor modules. In the interface unit of the semiconductor device, the dimensions of the main-terminal connecting bars of the supporting portion and the dimensions of the internal wirings of the accommodating portion may increase such that both the main-terminal connecting bars and the internal wirings can be connected to the main terminals and the signal terminals of the six semiconductor modules.

In the interface unit of the semiconductor device according to the embodiment of the present invention, four concave portions which are partially exposed are provided in the accommodating portion 30*a* and each upper end of the terminals in the semiconductor device and the internal wirings of the interface unit are connected to each other, using the concave portions. However, the present invention is not limited to the connection using the concave portions. For example, each upper end of the control terminals and the through-holes provided at the ends of the internal wirings may be electrically connected to each other by press-fitting. By press-fitting, it is possible to easily bond the members, since a bonding material like solder is not used.

In the semiconductor device according to the embodiment of the present invention, output, emitter and collector are arranged from left-side to right-side in this order, as illustrated in FIG. 5. However, the order is not limited to the order exemplified in FIG. 5 and may be appropriately changed, for example, like an order of emitter, collector and output from left-side right-side in state of FIG. 5. The structures of the semiconductor devices illustrated in FIGS. 1 to 19 may be partially combined to implement the semiconductor device according to the present invention. As described above, the present invention includes various embodiments etc. which have not been described above and the technical scope of the present invention is defined by only matters specifying the present invention described in the appropriate claims of the present invention.

What is claimed is:

1. A semiconductor device comprising:
a base plate;
a plurality of semiconductor units provided in parallel on the base plate, each semiconductor unit including a semiconductor chip and a unit-side control terminal connected to the semiconductor chip, the unit-side control terminal extending away from the base plate; and
an interface unit including an accommodating portion having a rod-shaped external connecting control terminal and having an internal space to accommodate an internal wiring, the internal wiring being connected to the unit-side control terminals extending from the plurality of semiconductor units, the rod-shaped external-connecting control terminal extending away from the semiconductor units and configured to be coupled to an external apparatus, the rod-shaped external-connecting control terminal being connected to the internal wiring.

2. The semiconductor device according to claim 1,
wherein a plurality of the internal wirings are provided, and
the plurality of internal wirings are stacked in a vertical direction in the internal space of the accommodating portion.

3. The semiconductor device according to claim 1,
wherein the internal wiring includes a base portion, a left branch portion and a right branch portion which extends from both ends of the base portion, respectively, and a central branch portion which extends from a center of the base portion,
the unit-side control terminal of one of the semiconductor units is connected to the left branch portion,
the unit-side control terminal of the other semiconductor unit which implements a pair with one of the semiconductor units is connected to the right branch portion, and
the rod-shaped external-connecting control terminal is connected to the central branch portion.

4. The semiconductor device according to claim 3,
wherein the accommodating portion includes a concave portion, and
each end of the left branch portion, the right branch portion, and the central branch portion are exposed inside the concave portion.

5. The semiconductor device according to claim 1,
wherein a plurality of the rod-shaped external-connecting control terminals is provided so as to extend from a flat outer surface of a center of the accommodating portion.

6. The semiconductor device according to claim 1,
wherein each of the semiconductor units further includes a main terminal connected to the semiconductor chip, a main current flows through the main terminal, and
the interface unit includes a main-terminal connecting bar connected to the main terminal and a rod-shaped supporting portion supporting the main-terminal connecting bar.

7. The semiconductor device according to claim 6,
wherein the rod-shaped supporting portion has one end provided at the center of the accommodating portion in a plane pattern.

8. The semiconductor device according to claim 1,
wherein the interface unit is bilaterally symmetric in a plane pattern.

9. The semiconductor device according to claim 1,
wherein the interface unit has convex portions protruding toward the semiconductor units,
each of the pair of semiconductor units has concave portions, and
the convex portions are capable of being fitted to the concave portions.

10. A method for manufacturing a semiconductor device comprising:
providing a plurality of semiconductor units in parallel on a base plate, each semiconductor unit including a semiconductor chip and a unit-side control terminal, the unit-side control terminal being connected to the semiconductor chip and extending away from the base plate;
mounting an interface unit on the plurality of semiconductor units, the interface unit including an accommodating portion having a rod-shaped external-connecting control terminal and having an internal space to accommodate an internal wiring, the internal wiring being connected to the unit-side control terminals extending from the plurality of semiconductor units, the rod-shaped external-connecting control terminal extending away from the semiconductor units and configured to be connected to an external apparatus, the rod-shaped external-connecting control terminal being connected to the internal wiring; and
connecting the unit-side control terminals of the plurality of semiconductor units to the internal wiring.

11. The method for manufacturing a semiconductor device according to claim 10,
wherein the connecting includes a process of inserting the unit-side control terminal into a through-hole provided in the internal wiring and connecting the unit-side control terminal to the internal wiring using press-fitting or caulking.

12. The method for manufacturing a semiconductor device according to claim 10,
wherein the connecting includes a process of inserting the unit-side control terminal into a through-hole provided in the internal wiring and connecting the unit-side control terminal to the internal wiring using welding or soldering.

13. An interface unit comprising:
an accommodating portion configured to be provided on a plurality of semiconductor units provided in parallel, each of the plurality of semiconductor units including a semiconductor chip and a unit-side control terminal connected to the semiconductor chip, the unit-side control terminal extending away from a base plate, the accommodating portion including:
a rod-shaped external-connecting control terminal, and
an internal space to accommodate an internal wiring configured to be connected to each of the plurality of the unit-side control terminals extending from the plurality of semiconductor units, the rod-shaped external-connecting control terminal extending away from the semiconductor units and configured to be connected to an external apparatus, the rod-shaped external-connecting control terminal being connected to the internal wiring.

* * * * *